United States Patent
Zhang et al.

(10) Patent No.: US 12,300,172 B2
(45) Date of Patent: May 13, 2025

(54) PIXEL CIRCUIT AND DRIVING METHOD THEREFOR AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Zhenhua Zhang, Beijing (CN); Dongfang Yang, Beijing (CN); Xilei Cao, Beijing (CN); Xueguang Hao, Beijing (CN); Lang Liu, Beijing (CN); Jingyi Feng, Beijing (CN); Changlong Yuan, Beijing (CN); Xiaoxin Li, Beijing (CN); Li Zhu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/273,239

(22) PCT Filed: Jul. 5, 2022

(86) PCT No.: PCT/CN2022/103892
§ 371 (c)(1),
(2) Date: Jul. 19, 2023

(87) PCT Pub. No.: WO2023/005621
PCT Pub. Date: Feb. 2, 2023

(65) Prior Publication Data
US 2024/0119897 A1    Apr. 11, 2024

(30) Foreign Application Priority Data
Jul. 30, 2021   (WO) ................ PCT/CN2021/109900
Aug. 5, 2021    (CN) .......................... 202110898671.4

(51) Int. Cl.
G09G 3/3233   (2016.01)
G09G 3/20     (2006.01)
H10K 59/121   (2023.01)

(52) U.S. Cl.
CPC ......... G09G 3/3233 (2013.01); G09G 3/2007 (2013.01); H10K 59/1213 (2023.02);
(Continued)

(58) Field of Classification Search
CPC ............... G09G 3/3233; G09G 3/2007; G09G 2300/0819; G09G 2300/0842;
(Continued)

(56) References Cited

U.S. PATENT DOCUMENTS 11,195,461 B2 * 12/2021 Jang ..................... G09G 3/3233
2017/0221420 A1    8/2017 Zhu
(Continued)

FOREIGN PATENT DOCUMENTS

CN    103778883 A    5/2014
CN    104751804 A    7/2015
(Continued)

OTHER PUBLICATIONS

Feb. 22, 2018 (CN) First Office Action; CN application No. 202110898671.4 with English Translation.
(Continued)

*Primary Examiner* — Douglas M Wilson
(74) *Attorney, Agent, or Firm* — Banner & Witcoff, Ltd.

(57) ABSTRACT

A pixel circuit and a driving method therefor and a display panel are provided. The pixel circuit includes a driving circuit, a data writing circuit, a storage circuit, and a first reset circuit; the driving circuit includes a control terminal, a first terminal, and a second terminal, and is configured to control a driving current flowing through the first terminal and the second terminal for driving a light-emitting element
(Continued)

to emit light; the data write circuit is configured to write a data signal into the control terminal of the driving circuit; the storage circuit is configured to store the data signal; the first reset circuit is configured to apply a first initialization voltage to the control terminal of the driving circuit; the driving circuit and the data write circuit each include an N-type thin film transistor; and the first reset circuit includes an N-type oxide thin film transistor.

18 Claims, 15 Drawing Sheets

(52) U.S. Cl.
CPC ............... *G09G 2300/0819* (2013.01); *G09G 2300/0842* (2013.01); *G09G 2300/0852* (2013.01); *G09G 2300/0861* (2013.01); *G09G 2310/08* (2013.01); *G09G 2320/0247* (2013.01); *G09G 2320/0257* (2013.01); *G09G 2330/021* (2013.01)

(58) Field of Classification Search
CPC ....... G09G 2300/0861; G09G 2310/08; G09G 2320/0247; G09G 2320/0257; G09G 2330/021; G09G 3/32; G09G 2300/0417; G09G 2300/0852; G09G 2320/0214; G09G 2320/0219; G09G 2320/0238; G09G 2320/043; G09G 2310/0251; G09G 2310/0262; G09G 2320/0233; G09G 2320/045; G09G 3/3225; G09G 3/3258; H10K 59/131
See application file for complete search history.

(56) References Cited

U.S. PATENT DOCUMENTS

| | | | |
|---|---|---|---|
| 2018/0005572 A1 | 1/2018 | Ka et al. | |
| 2018/0130410 A1 | 5/2018 | Gao et al. | |
| 2019/0088209 A1 | 3/2019 | Kang et al. | |
| 2019/0156747 A1 | 5/2019 | Nie et al. | |
| 2020/0184886 A1 | 6/2020 | Chun | |
| 2020/0226978 A1 | 7/2020 | Lin et al. | |
| 2021/0028258 A1 | 1/2021 | Lee et al. | |
| 2021/0134917 A1 | 5/2021 | Li et al. | |
| 2021/0242292 A1 | 8/2021 | Tsuboi | |
| 2021/0407390 A1 | 12/2021 | Li et al. | |
| 2022/0122522 A1 | 4/2022 | Li et al. | |
| 2022/0223107 A1 | 7/2022 | Chen et al. | |
| 2022/0309970 A1 | 9/2022 | Yu et al. | |
| 2022/0398977 A1* | 12/2022 | Xue | G09G 3/3291 |
| 2023/0091203 A1* | 3/2023 | Li | G09G 3/32 345/76 |

FOREIGN PATENT DOCUMENTS

| | | |
|---|---|---|
| CN | 106328061 A | 1/2017 |
| CN | 106652912 A | 5/2017 |
| CN | 107564467 A | 1/2018 |
| CN | 108376534 A | 8/2018 |
| CN | 109410835 A | 3/2019 |
| CN | 109872692 A | 6/2019 |
| CN | 110010072 A | 7/2019 |
| CN | 110223636 A | 9/2019 |
| CN | 110570813 A | 12/2019 |
| CN | 111179855 A | 5/2020 |
| CN | 111261109 A | 6/2020 |
| CN | 111292685 A | 6/2020 |
| CN | 111312160 A | 6/2020 |
| CN | 111768739 A | 10/2020 |
| CN | 112133253 A | 12/2020 |
| CN | 112150967 A | 12/2020 |
| CN | 112234091 A | 1/2021 |
| CN | 113160754 A | 7/2021 |
| CN | 113192458 A | 7/2021 |
| CN | 113838421 A | 12/2021 |
| KR | 20190074863 A | 6/2019 |
| KR | 20210085050 A | 7/2021 |

OTHER PUBLICATIONS

Jan. 29, 2024 (EP) Partial European Search Report—Application No. 21951408.0.
May 24, 2024 (US) Non-Final Office Action—U.S. Appl. No. 18/014,766.
Apr. 22, 2024 (EP) Extended European Search Report—Application No. 21951408.0.
Sep. 10, 2024 (KIR) First Office Action; KR application No. 10-2023-7028175 with English Translation.
Mar. 6, 2025 (CN) Second Office Action; CN application No. 202210701567.6 with English Translation.

* cited by examiner

PIXEL CIRCUIT AND DRIVING METHOD THEREFOR AND DISPLAY PANEL

CROSS-REFERENCE TO RELATED APPLICATION(S)

The present application is a national stage application of International Patent Application No. PCT/CN2022/103892, which claims the priority of PCT patent application PCT/CN2021/109900 filed on Jul. 30, 2021 and Chinese patent application No. 202110898671.4 filed on Aug. 5, 2021, and the entire contents of the above-mentioned Chinese patent applications are incorporated herein by reference as a part of the present application.

TECHNICAL FIELD

Embodiments of the present disclosure relate to a pixel circuit, a driving method thereof, and a display panel.

BACKGROUND

Organic Light-Emitting Diode (OLED) display panel possesses advantages such as small thickness, light weight, wide viewing angle, active luminescence, continuously adjustable luminous color, low cost, fast response speed, low energy consumption, low driving voltage, wide range of working temperature, simple production process, high luminous efficiency and capability of flexible display, etc., and hence is increasingly widely used in display fields such as mobile phones, tablet computers and digital cameras.

SUMMARY

At least some embodiments of the disclosure provides a pixel circuit, comprising a driving circuit, a data writing circuit, a storage circuit and a first reset circuit, wherein the driving circuit comprises a control terminal, a first terminal and a second terminal, and is configured to control a driving current flowing through the first terminal and the second terminal for driving a light-emitting element to emit light; the data writing circuit is configured to write a data signal to the control terminal of the driving circuit under a control of a first scanning signal; the storage circuit is configured to store the data signal; the first reset circuit is configured to apply a first initialization voltage to the control terminal of the driving circuit under a control of a first reset control signal; the driving circuit and the data writing circuit each comprise an N-type thin film transistor, and the first reset circuit comprises an N-type oxide thin film transistor.

For example, in the pixel circuit provided by some embodiments of the disclosure, the N-type thin film transistor comprised in the driving circuit is a first transistor; a gate electrode of the first transistor serves as the control terminal of the driving circuit, a first electrode of the first transistor serves as the first terminal of the driving circuit, and a second electrode of the first transistor serves as the second terminal of the driving circuit.

For example, in the pixel circuit provided by some embodiments of the disclosure, the N-type thin film transistor comprised in the data writing circuit is a second transistor; a gate electrode of the second transistor is connected to a first scanning signal terminal to receive the first scanning signal, a first electrode of the second transistor is connected to a data signal terminal to receive the data signal, and a second electrode of the second transistor is connected to the control terminal of the driving circuit.

For example, in the pixel circuit provided by some embodiments of the disclosure, the storage circuit comprises a storage capacitor, a first electrode of the storage capacitor is connected to the control terminal of the driving circuit, and a second electrode of the storage capacitor is connected to the second terminal of the driving circuit.

For example, in the pixel circuit provided by some embodiments of the disclosure, the N-type oxide thin film transistor comprised in the first reset circuit is a third transistor; a gate electrode of the third transistor is connected to a first reset control signal terminal to receive the first reset control signal, a first electrode of the third transistor is connected to a first initialization voltage terminal to receive the first initialization voltage, and a second electrode of the seventh transistor is connected to the control terminal of the driving circuit.

For example, the pixel circuit provided by some embodiments of the disclosure further comprises a second reset circuit, wherein, the second reset circuit is configured to apply a second initialization voltage to the second terminal of the driving circuit under a control of a second reset control signal.

For example, in the pixel circuit provided by some embodiments of the disclosure, the second reset circuit comprises a fourth transistor which is an N-type thin film transistor, a gate electrode of the fourth transistor is connected to a second reset control signal terminal to receive the second reset control signal, a first electrode of the fourth transistor is connected to a second initialization voltage terminal to receive the second initialization voltage, and a second electrode of the fourth transistor is connected to the second terminal of the driving circuit.

For example, the pixel circuit provided by some embodiments of the disclosure further comprises a first light emission control circuit, wherein the first light emission control circuit is configured to apply a first power supply voltage to the first terminal of the driving circuit under a control of a first light emission control signal.

For example, in the pixel circuit provided by some embodiments of the disclosure, the first light emission control circuit comprises a fifth transistor which is an N-type thin film transistor, a gate electrode of the fifth transistor is connected to a first light emission control terminal to receive the first light emission control signal, a first electrode of the fifth transistor is connected to a first power supply terminal to receive the first power supply voltage, and a second electrode of the fifth transistor is connected to the first terminal of the driving circuit.

For example, the pixel circuit provided by some embodiments of the disclosure further comprises a third reset circuit, wherein, the third reset circuit is configured to apply a holding voltage to the first terminal of the driving circuit under a control of a third reset control signal, the third reset control signal and the first reset control signal both are turn-on signals in at least part of a time period.

For example, in the pixel circuit provided by some embodiments of the disclosure, the third reset circuit comprises a sixth transistor which is an N-type thin film transistor, a gate electrode of the sixth transistor is connected to a third reset control signal terminal to receive the third reset control signal, a first electrode of the sixth transistor is connected to a holding voltage terminal to receive the holding voltage, and a second electrode of the sixth transistor is connected to the first terminal of the driving circuit.

For example, in the pixel circuit provided by some embodiments of the disclosure, the third reset control signal and the first reset control signal are the same control signal.

For example, the pixel circuit provided by some embodiments of the disclosure further comprises a second light emission control circuit, wherein the second light emission control circuit is configured to apply the driving current to a first electrode of the light-emitting element under a control of a second light emission control signal.

For example, in the pixel circuit provided by some embodiments of the disclosure, the second light emission control circuit comprises a seventh transistor which is an N-type thin film transistor, a gate electrode of the seventh transistor is connected to a second light emission control terminal to receive the second light emission control signal, a first electrode of the seventh transistor is connected to the second terminal of the driving circuit, and a second electrode of the seventh transistor is connected to the first electrode of the light-emitting element.

For example, the pixel circuit provided by some embodiments of the disclosure further comprises a voltage transmission circuit, wherein the voltage transmission circuit is configured to transmit a second power supply voltage to the first terminal of the driving circuit in a first time period, and to transmit a first power supply voltage different from the second power supply voltage to the first terminal of the driving circuit in a second time period, under a control of a voltage transmission control signal.

For example, in the pixel circuit provided by some embodiments of the disclosure, the voltage transmission circuit comprises an eighth transistor which is an N-type thin film transistor, a gate electrode of the eighth transistor is connected to a voltage transmission control signal terminal to receive the voltage transmission control signal, a first electrode of the eighth transistor is connected to a first power supply terminal, and a second electrode of the eighth transistor is connected to the first terminal of the driving circuit, the first power supply terminal is configured to provide the second power supply voltage in the first time period, and to provide the first power supply voltage in the second time period.

At least some embodiment of the disclosure provide a display panel, comprising a plurality of pixel units arranged in an array, wherein each of the plurality of pixel units comprises the pixel circuit according to any items as mentioned above.

At least some embodiment of the disclosure provide a driving method of a pixel circuit, comprising an initialization stage, a threshold voltage compensation stage, a data writing and mobility compensation stage, and a light emission stage, wherein in the initialization stage, inputting the first reset control signal and the second reset control signal, turning on the first reset circuit and the second reset circuit, applying the first initialization voltage to the control terminal of the driving circuit through the first reset circuit to reset the control terminal of the driving circuit, and applying the second initialization voltage to the second terminal of the driving circuit through the second reset circuit to reset the second terminal of the driving circuit; in the threshold voltage compensation stage, inputting the first reset control signal, turning on the first reset circuit, applying the first initialization voltage to the control terminal of the driving circuit through the first reset circuit to turn on the driving circuit, stopping an input of the second reset control signal, turning off the second reset circuit, and performing a threshold compensation through the turned-on driving circuit and the storage circuit; in the data writing stage, inputting the gate scanning signal, turning on the data writing circuit, writing the data signal into the control terminal of the driving circuit through the data writing circuit, and storing the data signal as written in through the storage circuit; in the light emission stage, stopping an input of the gate scanning signal, and turning off the data writing circuit, so that the driving circuit generates the driving current under a control of the data signal stored in the storage circuit to drive the light-emitting element to emit light.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
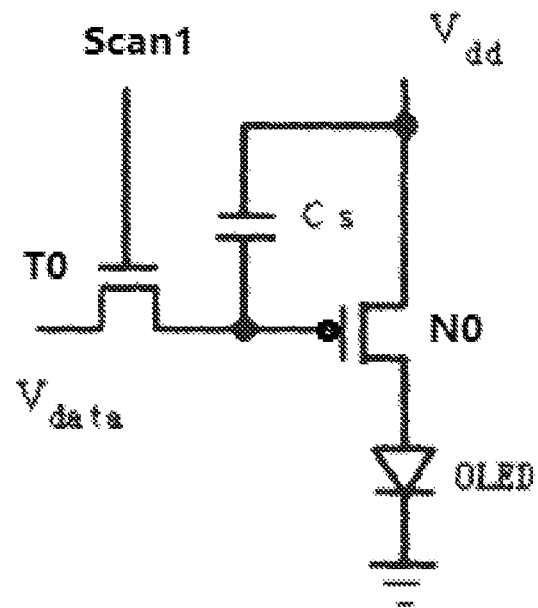
FIG. 1A is a schematic diagram of a 2T1C pixel circuit.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. Likewise, "a" or "an" or similar words do not mean the limitation to amount, instead, it refers to at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

Hereinafter, the present disclosure will be explained through several specific embodiments. In order to keep the following descriptions of the embodiments of the present disclosure clear and concise, detailed explanations of known functions and known components (elements) may be omitted. When any component (element) of an embodiment of the present disclosure appears in more than one figure, this component (element) is represented by the same or similar reference numeral in each figure.

Generally, matrix driving mode is adopted by pixel circuits in OLED display panels, and can be classified into Active Matrix (AM) driving mode and Passive Matrix (PM) driving mode depending on whether a switching component is introduced into each of the pixel units. For AMOLED, an assembly consisted of thin film transistor(s) and storage capacitor(s) is integrated in the pixel circuit (also referred to as "pixel driving circuit") of each pixel, and the current flowing through the OLED can be controlled through a driving control of the thin film transistor(s) and the storage capacitor(s), so that the OLED can emit light as needed. Therefore, AMOLED requires for less driving current, involves lower power consumption and possesses longer service life, which can meet the requirements of large-size display with high resolution and multi-grayscale. At the same time, AMOLED has obvious advantages in terms of viewing angle, color reproduction, power consumption and response time, and is suitable for display devices with high information content and high resolution.

The basic pixel circuit used in AMOLED display panels is usually a 2T1C pixel circuit, that is, two thin film transistors (TFTs) and one storage capacitor Cs are used to realize the basic function of driving the OLED to emit light.

Figure 1B:
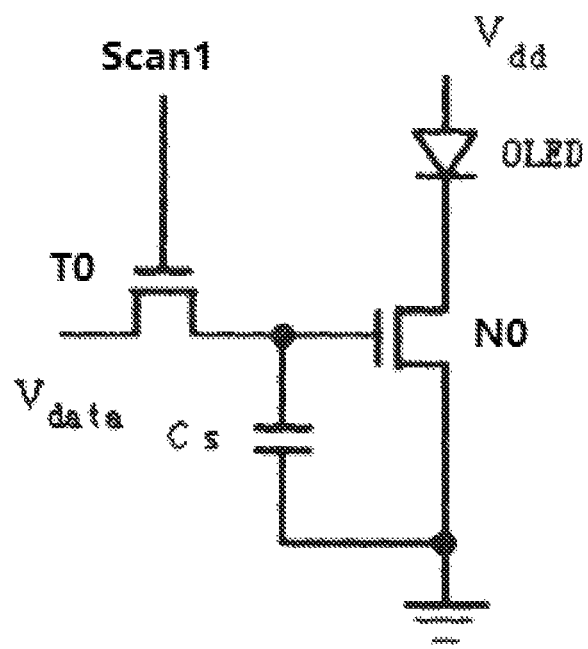
FIG. 1B is a schematic diagram of another 2T1C pixel circuit.

FIGS. 1A and 1B respectively show schematic diagrams of two types of 2T1C pixel circuits.

As shown in FIG. 1A, one type of 2T1C pixel circuit includes a switching transistor T0, a driving transistor N0, and a storage capacitor Cs. For example, a gate electrode of the switching transistor T0 is connected to a scanning line to receive a scanning signal Scan1, for example, a source electrode is connected to a data signal line to receive a data signal Vdata, and a drain electrode is connected to a gate electrode of the driving transistor N0; a source electrode of the driving transistor N0 is connected to a first voltage terminal to receive a first voltage VDD (high voltage), and a drain electrode is connected to a positive terminal of the OLED; one end of the storage capacitor Cs is connected to the drain electrode of the switching transistor T0 and the gate electrode of the driving transistor N0, and the other end is connected to the source electrode of the driving transistor N0 and the first voltage terminal; a negative terminal of the OLED is connected to a second voltage terminal to receive a second voltage Vss (low voltage, such as grounded voltage). The driving mode of the 2T1C pixel circuit is to control the luminance (grayscale) of the pixel by means of two TFTs and a storage capacitor Cs. When the scanning signal Scan1 is applied through the scanning line to turn on the switching transistor T0, the data signal Vdata input by a data driving circuit through the data signal line will charge the storage capacitor Cs through the switching transistor T0 so that the data signal Vdata is stored in the storage capacitor Cs, and the data signal Vdata as stored controls the level of the turn-on state of the driving transistor N0, thereby controlling a magnitude of the current flowing through the driving transistor and driving the OLED to emit light, that is, this current determines the grayscale of the light emitted by the pixel. In the 2T1C pixel circuit shown in FIG. 1A, the switching transistor T0 is an N-type transistor, while the driving transistor N0 is a P-type transistor.

As shown in FIG. 1B, another type of 2T1C pixel circuit also includes a switching transistor T0, a driving transistor N0 and a storage capacitor Cs, but the connection mode is slightly changed and the driving transistor N0 is an N-type transistor. The pixel circuit of FIG. 1B is different from that of FIG. 1A in that the positive terminal of OLED is connected to the first voltage terminal to receive the first voltage VDD (high voltage), while the negative terminal is connected to the drain electrode of the driving transistor N0, and the source electrode of the driving transistor N0 is connected to the second voltage terminal to receive the second voltage Vss (low voltage, such as grounded voltage). One end of the storage capacitor Cs is connected to the drain electrode of the switching transistor T0 and the gate electrode of the driving transistor N0, and the other end is connected to the source electrode of the driving transistor N0 and the second voltage terminal. The operation mode of the 2T1C pixel circuit is basically the same as that of the pixel circuit shown in FIG. 1A, and the details are not repeated here.

In addition, for the pixel circuits shown in FIGS. 1A and 1B, the switching transistor T0 is not limited to an N-type transistor but may also be a P-type transistor, as long as the polarity of the scanning signal Scan1 for controlling the switching transistor T0 to be turned on or turned off is changed accordingly.

A screen flicker is often occurred in an OLED display panel when it's switched between a high frequency and a low frequency, which affects the image quality and needs to be alleviated. The reason lies in that, in the OLED display panel, the driving transistor (DTFT) in the pixel circuit is made with a low-temperature polysilicon semiconductor served as an active layer, and its channel region per se exhibits an obvious hysteresis effect due to too many defect states. The hysteresis effect of a TFT component refers to an uncertainty of electrical characteristics of the TFT component under a certain bias voltage, that is, the magnitude of the current of the TFT component is not only related to the bias voltage at this moment but also depends on the state of the TFT component at the last moment. The hysteresis effect of TFT has caused harm to the existing flat panel display technology. For example, an image of a previous moment is often retained in an image display of a next moment, which results in display errors. The hysteresis effect of TFT component is related to gate dielectric, semiconductor materials and interface state traps there-between. These traps will capture and release electric charges, which causes the change of a threshold voltage of the TFT component, and then causes the change of a carrier concentration of the channel region under the same bias voltage, thereby changing the electrical characteristics of the TFT.

Therefore, based on the above-mentioned basic pixel circuit of 2T1C, a DTFT is manufactured by using an active layer with weaker hysteresis effect, and the DTFT is further reset in a reset stage or a programming stage, so that the characteristics of the DTFT can be restored to an initial state as soon as possible, thereby reducing the phenomena of afterimage and flicker at low frequency and improving the image quality.

At least some embodiments of the present disclosure provide a pixel circuit. The pixel circuit includes a driving circuit, a data writing circuit, a storage circuit and a first reset circuit; wherein the driving circuit includes a control terminal, a first terminal and a second terminal, and is configured to control a driving current flowing through the first terminal and the second terminal for driving a light-emitting element to emit light; the data writing circuit is configured to write a data signal into the control terminal of the driving circuit under the control of a gate scanning signal; the storage circuit is configured to store the data signal; the first reset circuit is configured to apply a first initialization voltage to the control terminal of the driving circuit under the control of a first reset control signal; wherein, the driving circuit and the data writing circuit include an N-type thin film transistor. The first reset circuit includes an N-type oxide thin film transistor.

Some embodiments of the present disclosure further provide a driving method and a display panel corresponding to the pixel circuit described above.

In the pixel circuit provided by the embodiments of the present disclosure, the driving circuit and the data writing circuit both include an N-type thin film transistor. The first reset circuit includes an N-type oxide thin film transistor, which can reduce low-frequency leakage, maintain the voltage at the control terminal of the driving circuit to avoid flicker when emitting light, alleviate the hysteresis of the TFT component and reduce the low-frequency afterimage.

Several embodiments of the present disclosure and examples thereof will be described in detail below with reference to the accompanying drawings.

Figure 2A:
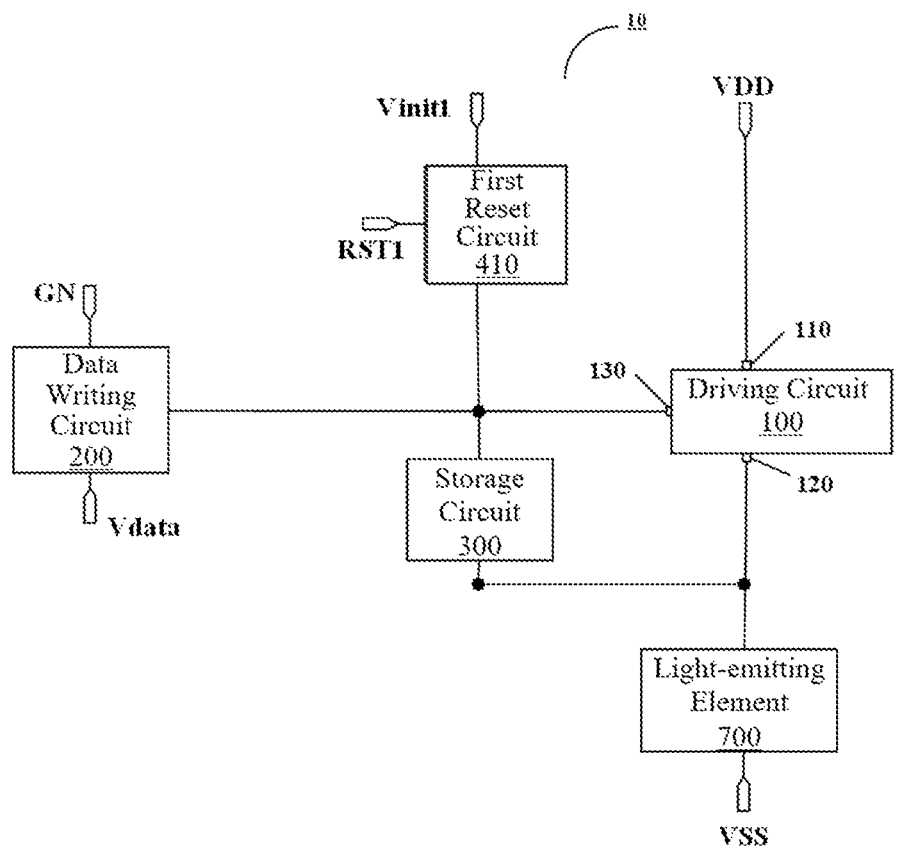
FIG. 2A is a schematic block diagram of a pixel circuit provided by at least some embodiments of the present disclosure.

FIG. 2A is a schematic block diagram of a pixel circuit provided by at least some embodiments of the present disclosure. As shown in FIG. 2A, the pixel circuit 10 includes a driving circuit 100, a data writing circuit 200, a storage circuit 300, a first reset circuit 410 and a light-emitting element 700.

For example, the driving circuit 100 includes a first terminal 110, a second terminal 120 and a control terminal 130, and is configured to control a driving current flowing through the first terminal 110 and the second terminal 120 for driving the light-emitting element 700 to emit light. For example, the driving circuit 100 includes an N-type thin film transistor, such as an N-type oxide thin film transistor. For example, in some embodiments, in a light emission stage, the driving circuit 100 can provide a driving current to the light-emitting element 700 to drive the light-emitting element 700 to emit light, and a corresponding driving current for light emission can be provided according to the grayscale to be displayed (different grayscales correspond to different data signals). For example, an organic light-emitting diode (OLED), a mini light-emitting diode (Mini LED), a micro light-emitting diode (Micro LED), a quantum dot light-emitting diode (QLED), an inorganic light-emitting diode or the like can be adopted as the light-emitting element 700, and embodiments of the present disclosure include these cases but are not limited thereto.

For example, the first reset circuit 410 is configured to apply a first initialization voltage Vinit1 to the control terminal 130 of the driving circuit 100 in response to a first reset control signal RST1. For example, the first reset circuit 410 may be an N-type oxide thin film transistor. For example, in some embodiments, in an initialization stage, the first reset circuit 410 is turned on in response to the first reset control signal RST1, so that the first initialization voltage Vinit1 can be applied to the control terminal 130 of the driving circuit 100 to initialize the driving circuit 100. Indium Gallium Zinc Oxide (IGZO) or the like may be used as a material of an active layer of the N-type oxide thin film transistor, so that the size of the transistor can be effectively decreased and the leakage current can be reduced as compared with the case of using Low Temperature Poly Silicon (LTPS) or amorphous silicon (such as hydrogenated amorphous silicon) as a material of the active layer of the thin film transistor; therefore, the pixel circuit can be suitable for low-frequency driving mode while the resolution of the display panel can be increased.

For example, the data writing circuit 200 is configured to write the data signal Vdata transmitted through a data line into the control terminal 130 of the driving circuit 100 in response to a gate scanning signal GN. For example, the data writing circuit 200 includes an N-type thin film transistor, such as an N-type oxide thin film transistor. For example, in some embodiments, in a data writing stage, the data writing circuit 200 is turned on in response to the gate scanning signal GN, so that the data signal Vdata transmitted through the data line can be written into the control terminal 130 of the driving circuit 100 and stored in the storage circuit 300; in this way, a driving current for driving the light-emitting element 700 to emit light can be generated by the driving circuit 100 according to the data signal Vdata in the light emission stage.

For example, the storage circuit 300 is configured to store the data signal Vdata as written in, and to electrically connect the control terminal 130 and the second terminal 120 of the driving circuit 100. For example, in some embodiments, the storage circuit 300 includes a storage capacitor that can receive and store the data signal Vdata written in by the data writing circuit 200 during data writing and storage stages. The storage circuit 300 electrically connects the control terminal 130 and the second terminal 120 of the driving circuit 100, so that information about a threshold voltage Vth of the driving circuit is also stored in the storage capacitor accordingly.

Figure 3A:
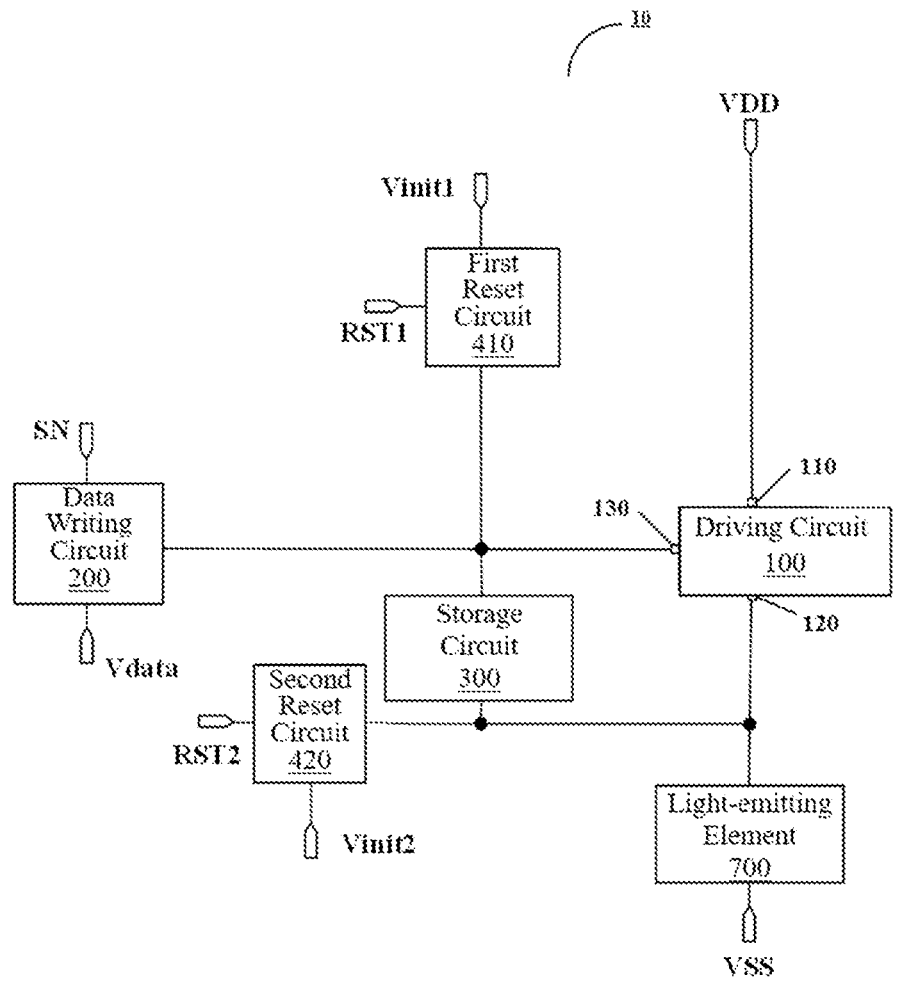
FIG. 3A is a schematic block diagram of a pixel circuit provided by at least some embodiments of the present disclosure.

For example, in at least some embodiments of the present disclosure, as shown in FIG. 3A on the basis of the circuit structure shown in FIG. 2A, the pixel circuit 10 may further include a second reset circuit 420 configured to apply a second initialization voltage Vinit2 to the second terminal 120 of the driving circuit 100 under the control of a second reset control signal RST2. For example, the second reset circuit 420 may include an N-type thin film transistor, such as an N-type oxide thin film transistor. For example, in some embodiments, in the initialization stage, the second reset circuit 420 is turned on in response to the second reset control signal RST2, so that the second initialization voltage Vinit2 can be applied to the second terminal 120 of the driving circuit 100, and that a potential at the second terminal 120 of the driving circuit 100 is initialized to the second initialization voltage Vinit2 according to the second initialization voltage Vinit2, thereby initializing the second terminal of the driving circuit 100 and eliminating the influence of a previous light emission stage.

Figure 4A:
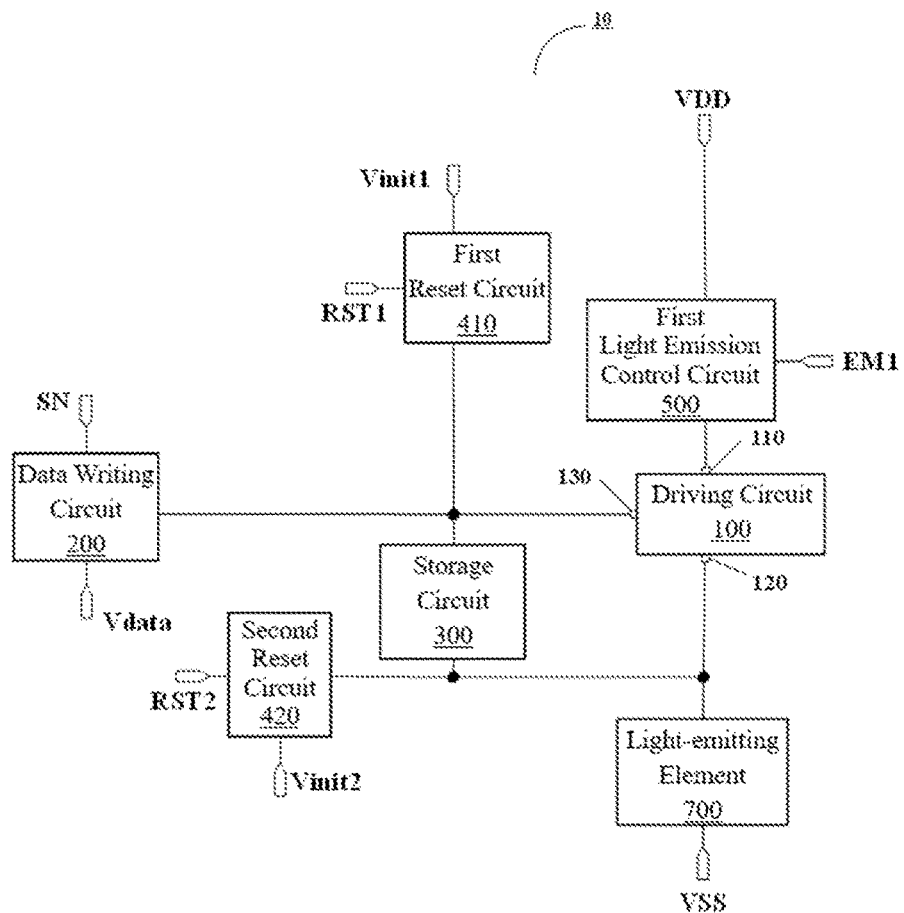
FIG. 4A is a schematic block diagram of a pixel circuit provided by at least some embodiments of the present disclosure.

For example, in at least some embodiments of the present disclosure, as shown in FIG. 4A on the basis of the circuit structure shown in FIG. 3A, the pixel circuit 10 may further include a first light emission control circuit 500. For example, in some embodiments, the first light emission control circuit 500 may be an N-type thin film transistor, such as an N-type oxide thin film transistor. For example, in some embodiments, the first light emission control circuit 500 is configured to apply a first power supply voltage VDD to the first terminal 110 of the driving circuit 100 in response to a first light emission control signal EM1, so that the driving circuit 100 generates a driving current. For example, in the light emission stage, the first light emission control circuit 500 is turned on in response to the first light emission control signal EM1, and the first power supply voltage VDD is applied to the first terminal 110 of the driving circuit 100, so that the driving circuit 100 can generate a driving current under the combined action of a voltage at the control terminal and a voltage at the first terminal; while in a non-light emission stage, the first light emission control circuit 500 is turned off in response to the first light emission control signal EM1, so that no driving current is generated by the driving circuit 100 to prevent the light-emitting element 700 from emitting light, thereby improving the contrast of the corresponding display device.

Figure 5A:
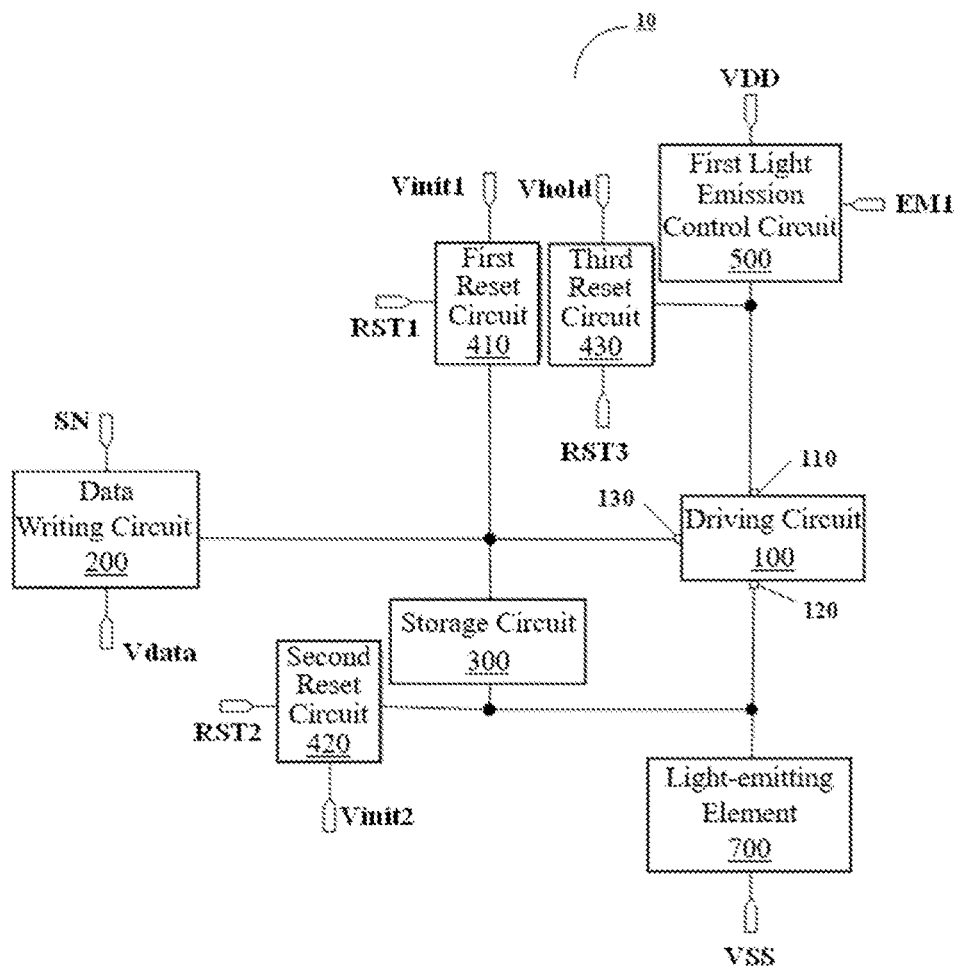
FIG. 5A is a schematic block diagram of a pixel circuit provided by at least some embodiments of the present disclosure.

For example, in at least some embodiments of the present disclosure, as shown in FIG. 5A on the basis of the circuit structure shown in FIG. 4A, the pixel circuit 10 may further include a third reset circuit 430. For example, in some embodiments, the third reset circuit 430 may be an N-type thin film transistor, such as an N-type oxide thin film transistor, which is configured to apply a holding voltage Vhold to the first terminal 110 of the driving circuit 100 under the control of a third reset control signal RST3 to weaken a characteristic drift of the driving circuit 100. For example, in some embodiments, the third reset control signal RST3 and the first reset control signal RST1 are both turn-on signals for at least part of the time period.

Figure 5B:
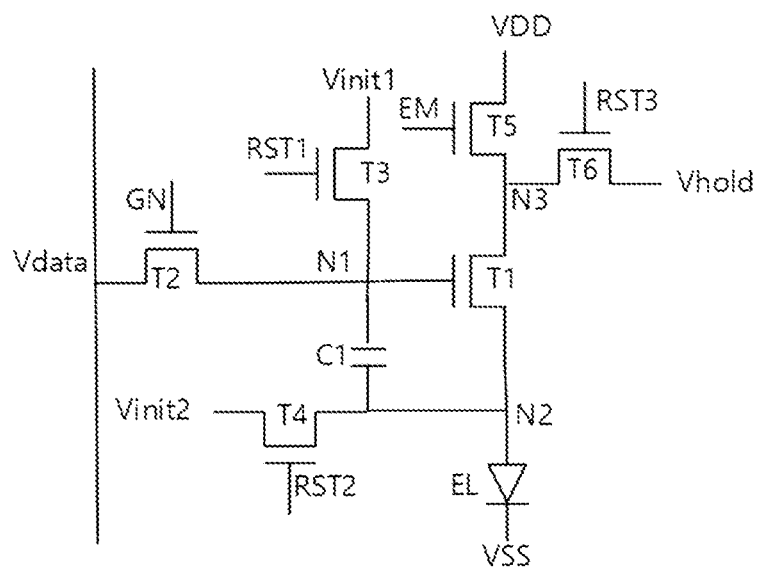
FIG. 5B is a schematic circuit structure diagram of a specific implementation example of the pixel circuit shown in FIG. 5A.
Figure 5C:
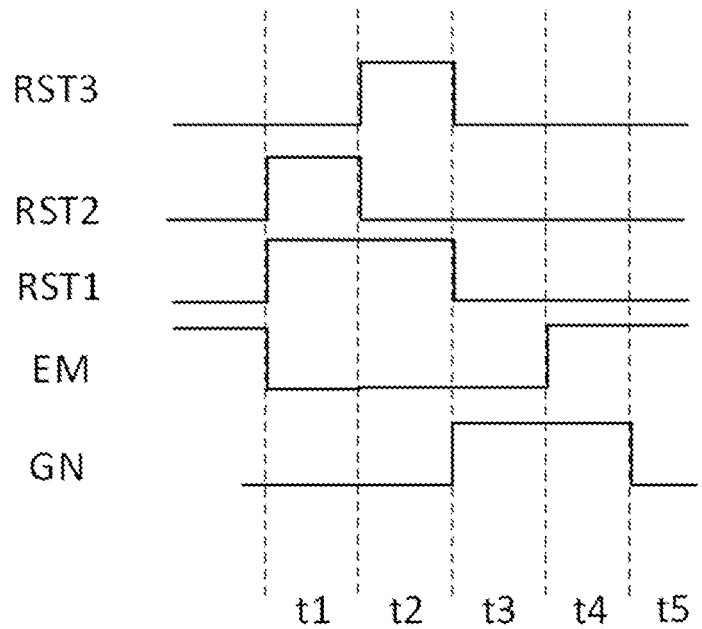
FIG. 5C is a signal timing diagram of a driving method of the pixel circuit shown in FIG. 5B.
Figure 5D:
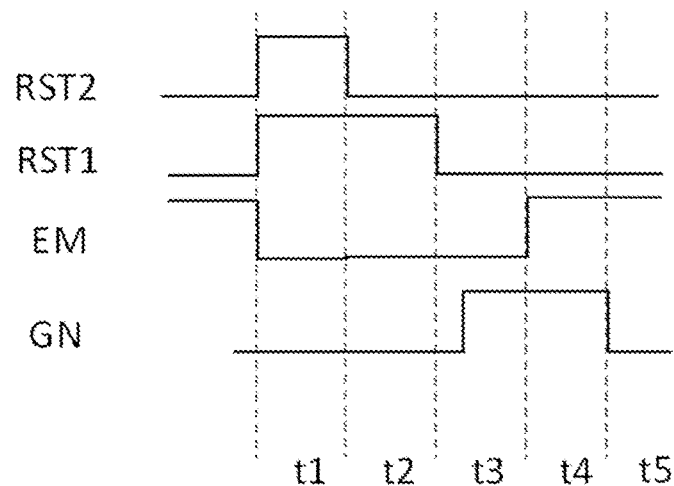
FIG. 5D is a signal timing diagram of a driving method of a pixel circuit provided by at least some embodiments of the present disclosure.

For example, in at least some embodiments of the present disclosure, as shown in FIG. 5D, the third reset control signal RST3 and the first reset control signal RST1 may be the same control signal, that is, the same timing sequence may be used to achieve the effect of weakening the hysteresis of the driving circuit 100.

It should be noted that in the embodiments of the present disclosure, the first reset control signal RST1, the second reset control signal RST2 and the third reset control signal RST3 are named to distinguish three control signals (for example, reset control signals) with different timing sequences. For example, in some embodiments, when the pixel circuits 10 of a plurality of pixel units in the display panel are arranged in an array, the second reset control signal RST2 and the third reset control signal RST3 may be subordinate to each other. For example, for one row of pixel units, the second reset control signal RST2 for controlling the second reset circuit 420 in the pixel circuit 10 of the pixel unit of this row can also be used for controlling the third reset circuit 430 in the pixel circuit 10 of the pixel unit of a previous row, that is, reused as the third reset control signal RST3 of the pixel circuit 10 of the pixel unit of the previous row; similarly, the third reset control signal RST3 for controlling the third reset circuit 430 in the pixel circuit 10 of the pixel unit of this row can also be used for controlling the second reset circuit 420 in the pixel circuit 10 of the pixel unit of a next row, that is, reused as the second reset control signal RST2 of the pixel circuit 10 of the pixel unit of the next row. In this way, the second reset control signal RST2 and the third reset control signal RST3 can be provided by the one and same GOA (Gate driver On Array), which is beneficial to simplifying the wiring layout of the display screen, improving the resolution, and realizing a narrow frame.

Figure 6A:
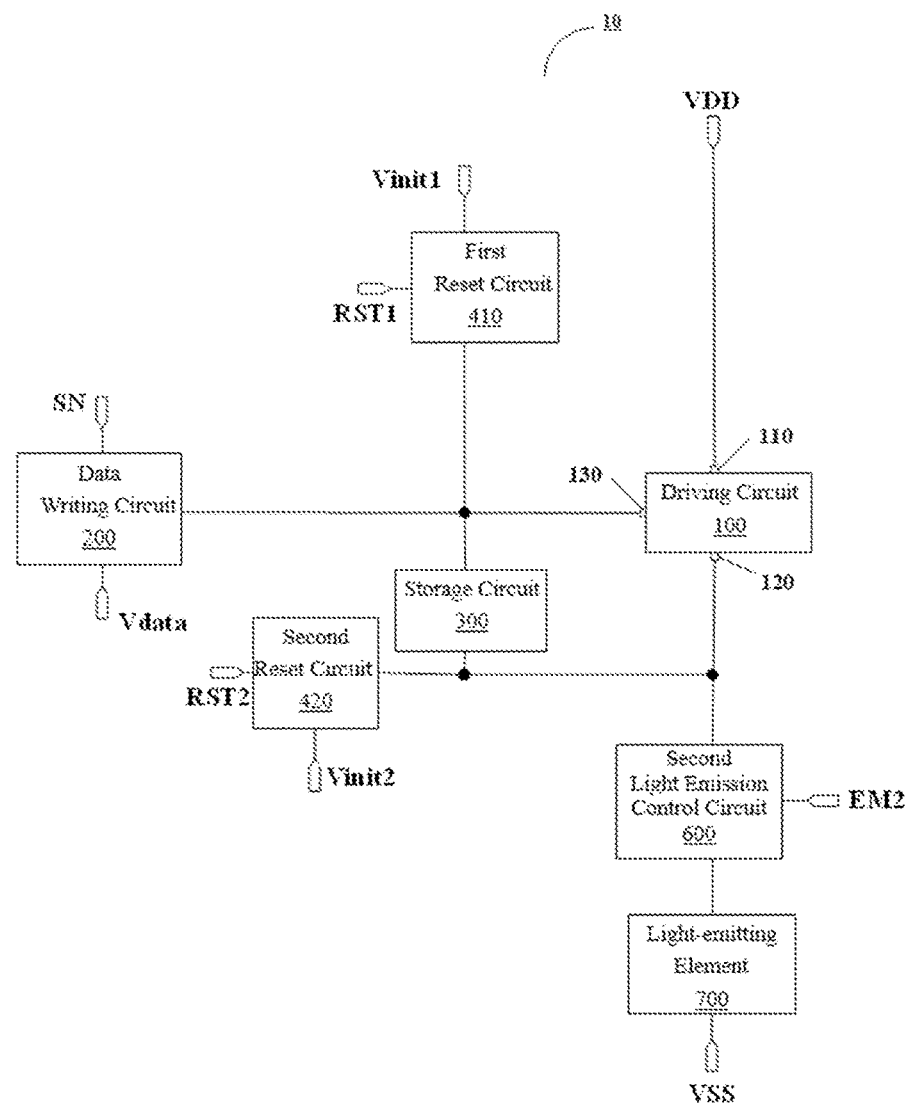
FIG. 6A is a schematic block diagram of a pixel circuit provided by at least some embodiments of the present disclosure.

For example, in at least some embodiments of the present disclosure, as shown in FIG. 6A on the basis of the circuit structure shown in FIG. 3A, the pixel circuit 10 may further include a second light emission control circuit 600. For example, in some embodiments, the second light emission control circuit 600 may be an N-type thin film transistor, such as an N-type oxide thin film transistor. For example, in some embodiments, the second light emission control circuit 600 is configured to apply the driving current to a first electrode of the light-emitting element 700 under the control of a second light emission control signal EM2, so that the light-emitting element 700 emits light. For example, in the light emission stage, the second light emission control circuit 600 is turned on in response to the second light emission control signal EM2, so that the driving circuit 100 can apply the driving current to the light-emitting element 700 through the second light emission control circuit 600 to drive the light-emitting element 700 to emit light; while in the non-light emission stage, the second light emission control circuit 600 is turned off in response to the second light emission control signal EM2 to prevent the light-emitting element 700 from emitting light, so that the contrast of the corresponding display device can be improved.

Figure 7A:
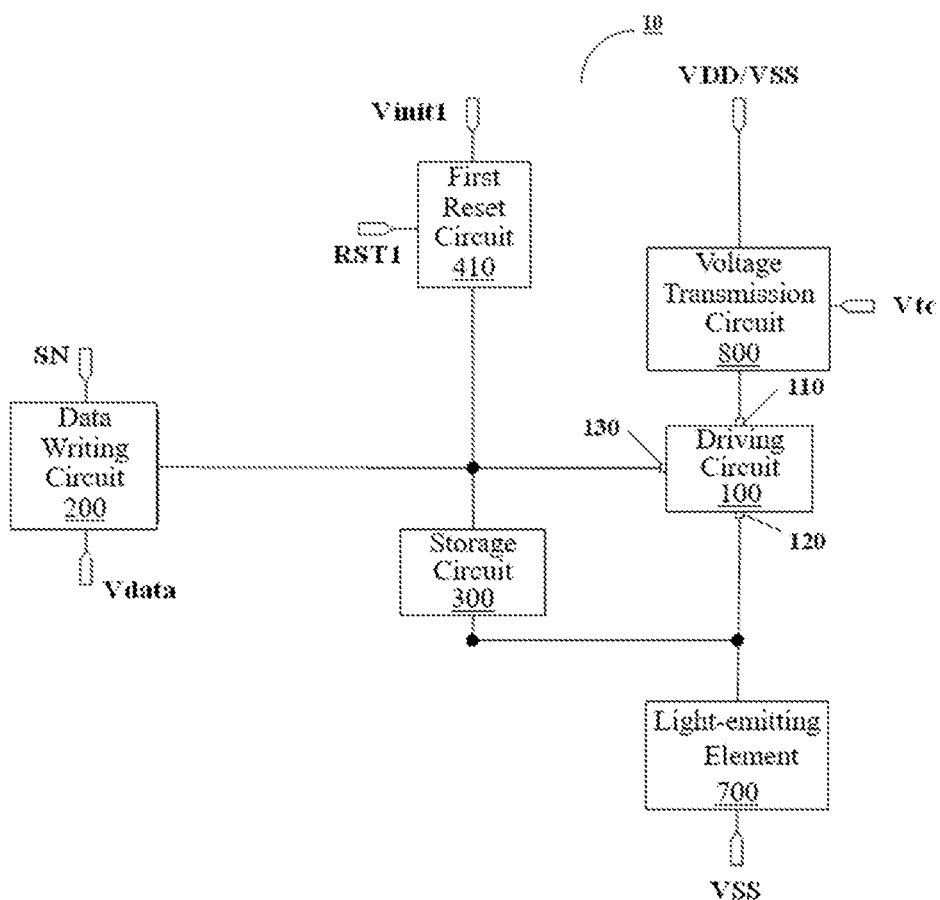
FIG. 7A is a schematic block diagram of a pixel circuit provided by at least some embodiments of the present disclosure.

For example, in at least some embodiments of the present disclosure, as shown in FIG. 7A on the basis of the circuit structure shown in FIG. 2A, the pixel circuit 10 may further include a voltage transmission circuit 800. For example, in some embodiments, the voltage transmission circuit 800 may be an N-type thin film transistor, such as an N-type oxide thin film transistor, which is configured to transmit a second power supply voltage, such as VSS, to the first terminal 110 of the driving circuit 100 during a first time period, and to transmit a first power supply voltage, such as VDD, different from the second power supply voltage to the first terminal 110 of the driving circuit 100 during a second time period, for example, after t2, under the control of a voltage transmission control signal Vtc.

Figure 8A:
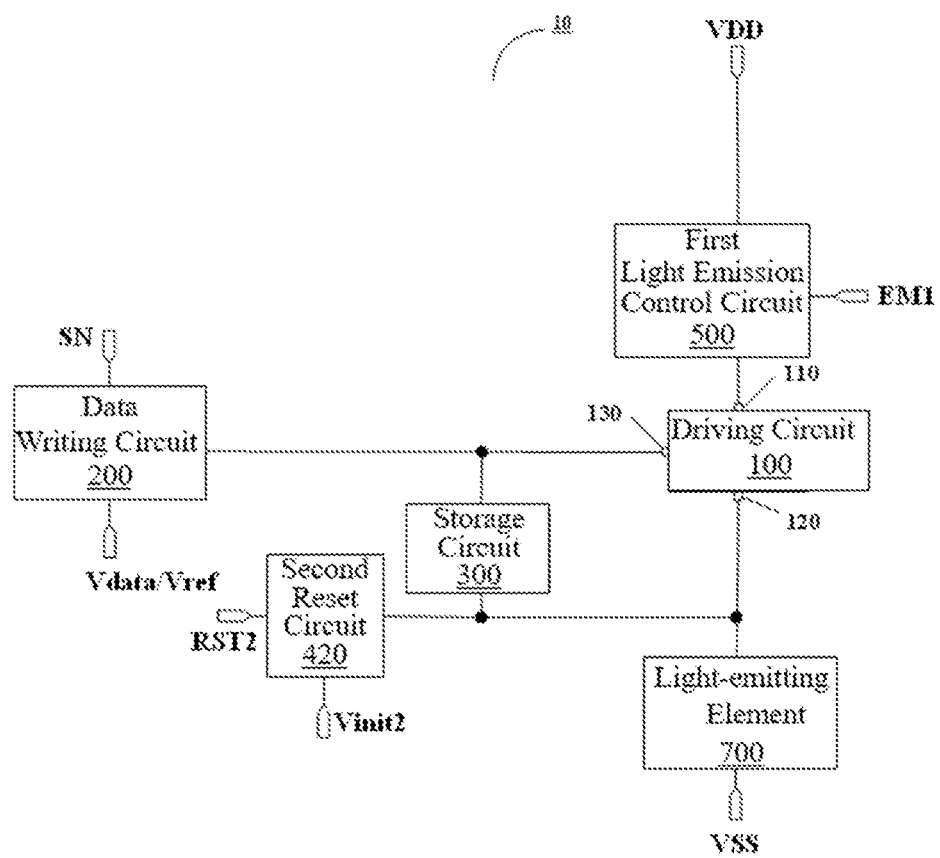
FIG. 8A is a schematic block diagram of a pixel circuit provided by at least some embodiments of the present disclosure.

For example, in at least some embodiments of the present disclosure, as shown in FIG. 8A on the basis of the circuit structure shown in FIG. 3A, it's also possible for the pixel circuit 10 to include the second reset circuit 420 but not include the first reset circuit 410. For example, in some embodiments, the data signal terminal transmits a reference voltage Vref, such as the first initialization voltage Vinit1, to a first terminal of the data writing circuit 200 in a first time period, such as t1, t2 and t3, so that the initialization of the control terminal 130 of the driving circuit 100 is completed; and the data signal terminal transmits the data signal Vdata to the first terminal of the data writing circuit 200 to write in the data signal Vdata and store the same in the storage circuit 300 in a second time period, such as t3, t4 and t5, so that the driving circuit 100 can generate a driving current for driving the light-emitting element 700 to emit light according to the data signal Vdata in the light emission stage.

Figure 2B:
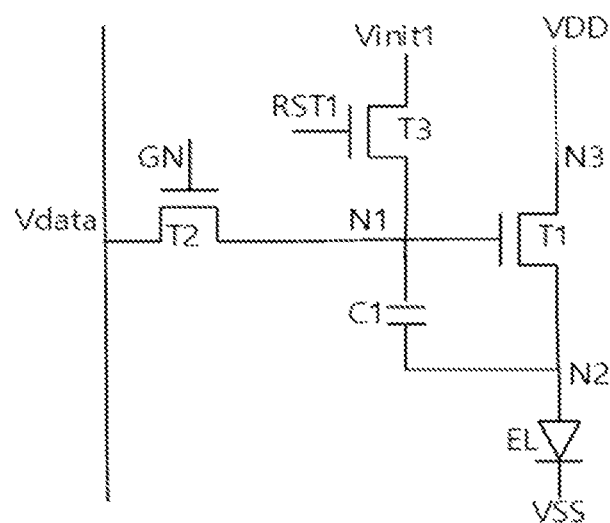
FIG. 2B is a schematic circuit structure diagram of a specific implementation example of the pixel circuit shown in FIG. 2A.

FIG. 2B is a schematic circuit structure diagram of a specific example of the pixel circuit shown in FIG. 2A. As shown in FIG. 2B, the pixel circuit 10 includes first to third transistors T1, T2 and T3, a storage capacitor C1 and a light-emitting element LE. For example, the first transistor T1 is used as a driving transistor, and the other second and third transistors T2 and T3 are used as switching transistors. For example, OLED can be adopted as the light-emitting element LE, but the embodiments of the present disclosure include but are not limited to this. The following embodiments are all described with reference to the case of OLED by way of example, which will not be repeated.

The OLED can be of various types, such as a top emission type, a bottom emission type, etc., and can emit red light, green light, blue light or white light, etc., which is not limited by the embodiments of the present disclosure. In addition, it should be also noted that the following embodiments are also illustrated with reference to the case where each of the transistors is an N-type transistor by way of example, which is not intended to constitute any limitation to the embodiments of the present disclosure.

For example, the first to third transistors T1, T2 and T3 above may all be N-type thin film transistors, wherein the first to third transistors T1, T2 and T3 may all be N-type oxide thin film transistors. When an N-type oxide thin film transistor is adopted, Indium Gallium Zinc Oxide (IGZO) can be used as a material of the active layer of the thin film transistor, so that the size of the transistor can be effectively reduced and the leakage current can be avoided as compared with the case of using Low Temperature Poly Silicon (LTPS) or amorphous silicon (such as hydrogenated amorphous silicon) as the material of the active layer of the thin film transistor.

For example, as shown in FIG. 2B, the driving circuit 100 may be implemented as a first transistor T1, wherein the first transistor T1 may be an N-type thin film transistor, such as an N-type oxide thin film transistor. A gate electrode of the first transistor T1 serves as the control terminal 130 of the driving circuit 100 and is connected to a first node N1; a first electrode of the first transistor T1 serves as the first terminal 110 of the driving circuit 100 and is connected to the first power supply terminal VDD through a third node N3 to receive the first power supply voltage VDD; and a second electrode of the first transistor T1 serves as the second terminal 120 of the driving circuit 100 and is connected to a second node N2. For example, the first power supply voltage VDD may be a driving voltage, such as a high voltage (with respect to the second power supply voltage VSS connected to the light-emitting element, which will be described in detail below).

For example, as shown in FIG. 2B, the data writing circuit 200 may be implemented as a second transistor T2, wherein the second transistor T2 may be an N-type thin film transistor, such as an N-type oxide thin film transistor. A gate electrode of the second transistor T2 is connected to a gate scanning signal terminal to receive the gate scanning signal GN. A first electrode of the second transistor T2 is connected to the data signal terminal to receive the data signal Vdata, and a second electrode of the second transistor T2 is connected to the first node N1 (the control terminal 130 of the driving circuit 100).

For example, as shown in FIG. 2B, the storage circuit 300 may be implemented as a storage capacitor C1, a first end of the storage capacitor C1 is connected to the first node N1 (the control terminal 130 of the driving circuit 100), and a second end of the storage capacitor C1 is connected to the second node N2 (the second terminal 120 of the driving circuit 100).

For example, as shown in FIG. 2B, the first reset circuit 410 may be implemented as a third transistor T3, wherein the third transistor T3 is an N-type oxide thin film transistor. A gate electrode of the third transistor T3 is connected to a first reset control signal terminal to receive the first reset control signal RST1, a first electrode of the third transistor T3 is connected to a first initialization voltage terminal to receive the first initialization voltage Vinit1, and a second electrode of the third transistor T3 is connected to the first node N1 (the control terminal 130 of the driving circuit 100).

Figure 3B:
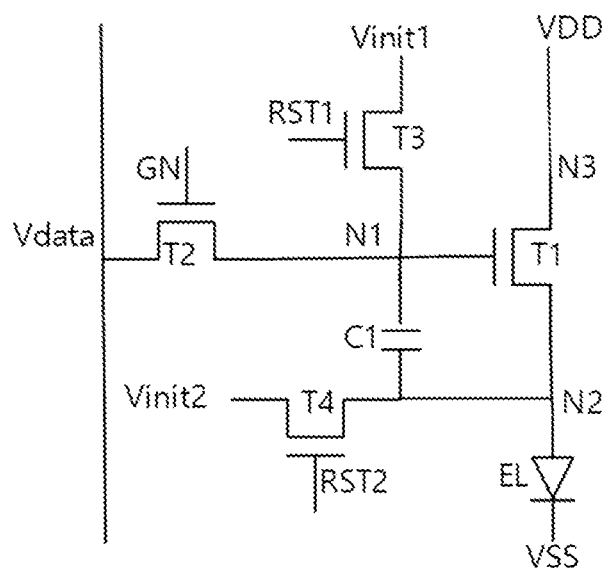
FIG. 3B is a schematic circuit structure diagram of a specific implementation example of the pixel circuit shown in FIG. 3A.

FIG. 3B is a schematic circuit structure diagram of a specific example of the pixel circuit shown in FIG. 3A. As shown in FIG. 3B, the pixel circuit 10 includes first to fourth transistors T1, T2, T3 and T4, a storage capacitor C1 and a light-emitting element LE. The pixel circuit 10 shown in FIG. 3B is different from the pixel circuit 10 shown in FIG. 2B in that the pixel circuit 10 shown in FIG. 3B further includes a fourth transistor T4 for implementing the second reset circuit 420. The other structures of the pixel circuit 10 shown in FIG. 3B are the same as those of the pixel circuit 10 shown in FIG. 2B, and the details will not be described here.

For example, the first to fourth transistors T1, T2, T3 and T4 above may all be N-type thin film transistors, wherein the first to fourth transistors T1, T2, T3 and T4 may all be N-type oxide thin film transistors. When an N-type oxide thin film transistor is adopted, Indium Gallium Zinc Oxide (IGZO) can be used as a material of an active layer of the thin film transistor, so that the size of the transistor can be effectively reduced and the leakage current can be avoided as compared with the case of using Low Temperature Poly Silicon (LTPS) or amorphous silicon (such as hydrogenated amorphous silicon) as the material of the active layer of the thin film transistor.

For example, as shown in FIG. 3B, the second reset circuit 420 may be implemented as a fourth transistor T4, wherein the fourth transistor T4 may be an N-type thin film transistor, such as an N-type oxide thin film transistor. A gate electrode of the fourth transistor T4 is connected to a second reset control signal terminal to receive the second reset control signal RST2, a first electrode of the fourth transistor T4 is connected to a second initialization voltage terminal to receive the second initialization voltage Vinit2, and a second electrode of the fourth transistor T4 is connected to the second node N2 (the second terminal 120 of the driving circuit 100).

Figure 4B:
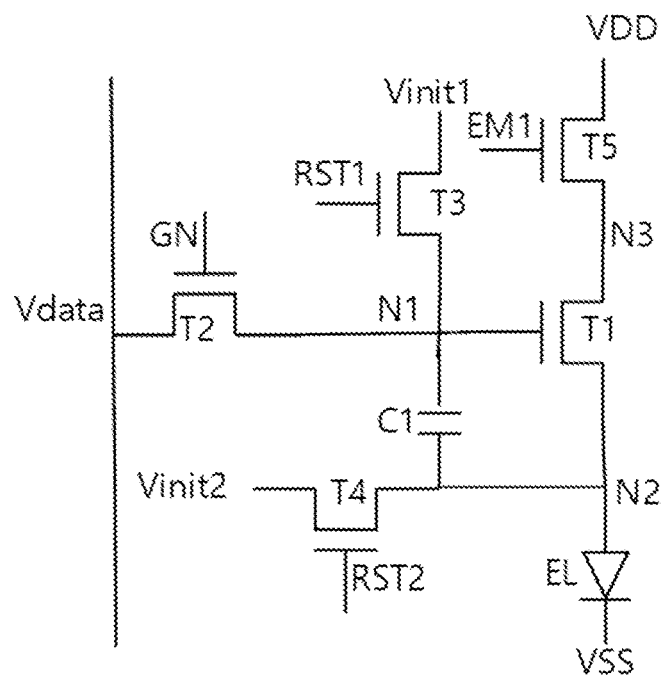
FIG. 4B is a schematic circuit structure diagram of a specific implementation example of the pixel circuit shown in FIG. 4A.

FIG. 4B is a schematic circuit structure diagram of a specific example of the pixel circuit shown in FIG. 4A. As shown in FIG. 4B, the pixel circuit 10 includes first to fifth transistors T1, T2, T3, T4 and T5, a storage capacitor C1 and a light-emitting element LE. The pixel circuit 10 shown in FIG. 4B is different from the pixel circuit 10 shown in FIG. 3B in that the pixel circuit 10 shown in FIG. 4B further includes a fifth transistor T5 for implementing the first light emission control circuit 500. The other structures of the pixel circuit 10 shown in FIG. 4B are the same as those the pixel circuit 10 shown in FIG. 3B, and the details will not be described here.

For example, the first to fifth transistors T1, T2, T3, T4 and T5 described above may all be N-type thin film transistors, wherein the first to fifth transistors T1, T2, T3, T4 and T5 may all be N-type oxide thin film transistors. When an N-type oxide thin film transistor is adopted, Indium Gallium Zinc Oxide (IGZO) can be used as the material of the active layer of the thin film transistor, so that the size of the transistor can be effectively reduced and the leakage current can be avoided as compared with the case of using Low Temperature Poly Silicon (LTPS) or amorphous silicon (such as hydrogenated amorphous silicon) as the material of the active layer of the thin film transistor.

For example, as shown in FIG. 4B, the first light emission control circuit 500 may be implemented as a fifth transistor T5, wherein the fifth transistor T5 may be an N-type thin film transistor, such as an N-type oxide thin film transistor; a gate electrode of the fifth transistor T5 is connected to a first light emission control terminal to receive the first light emission control signal EM1, a first electrode of the fifth transistor T5 is connected to the first power supply terminal to receive the first power supply voltage VDD, and a second electrode of the fifth transistor is connected to the third node N3 (the first terminal 110 of the driving circuit 100).

FIG. 5B is a schematic circuit structure diagram of a specific example of the pixel circuit shown in FIG. 5A. As shown in FIG. 5B, the pixel circuit 10 includes first to sixth transistors T1, T2, T3, T4, T5 and T6, a storage capacitor C1 and a light-emitting element LE. The pixel circuit 10 shown in FIG. 5B is different from the pixel circuit 10 shown in FIG. 4B in that the pixel circuit 10 shown in FIG. 5B further includes a sixth transistor T6 for implementing the third reset circuit 430. The other structures of the pixel circuit 10 shown in FIG. 5B are the same as those of the pixel circuit 10 shown in FIG. 4B, and the details will not be described here.

For example, the first to sixth transistors T1, T2, T3, T4, T5 and T6 above may all be N-type thin film transistors, wherein the first to sixth transistors T1, T2, T3, T4, T5 and T6 may all be N-type oxide thin film transistors. When an N-type oxide thin film transistor is adopted, Indium Gallium Zinc Oxide (IGZO) can be used as the material of the active layer of the thin film transistor, so that the size of the transistor can be effectively reduced and the leakage current can be avoided as compared with the case of using Low Temperature Poly Silicon (LTPS) or amorphous silicon (such as hydrogenated amorphous silicon) as the material of the active layer of the thin film transistor.

For example, as shown in FIG. 5B, the third reset circuit 430 may be implemented as a sixth transistor T6, wherein the sixth transistor T6 may be an N-type thin film transistor, such as an N-type oxide thin film transistor. A gate electrode of the sixth transistor T6 is connected to a third reset control signal terminal to receive the third reset control signal RST3, a first electrode of the sixth transistor T6 is connected to a holding voltage terminal to receive the holding voltage Vhold, and a second electrode of the sixth transistor T6 is connected to the third node N3 (the first terminal 110 of the driving circuit 100).

Figure 6B:
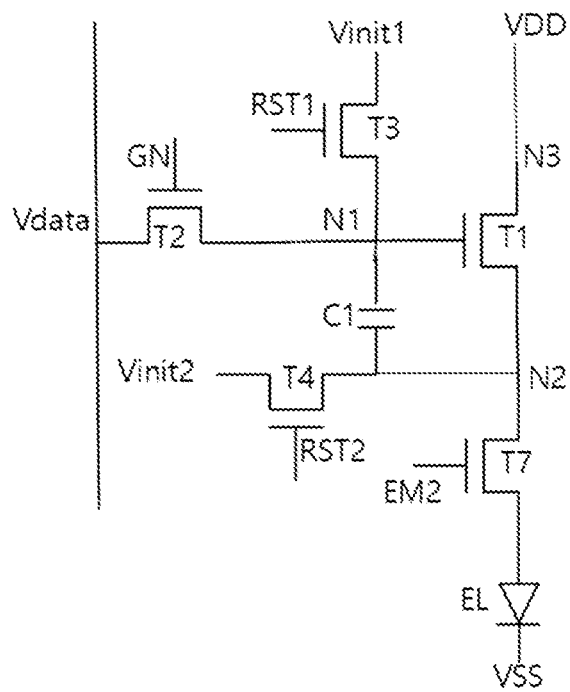
FIG. 6B is a schematic circuit structure diagram of a specific implementation example of the pixel circuit shown in FIG. 6A.

FIG. 6B is a schematic circuit structure diagram of a specific example of the pixel circuit shown in FIG. 6A. As shown in FIG. 6B, the pixel circuit 10 includes transistors T1, T2, T3, T4 and T7, a storage capacitor C1 and a light-emitting element LE. The pixel circuit 10 shown in FIG. 6B is different from the pixel circuit 10 shown in FIG. 3B in that the pixel circuit 10 shown in FIG. 6B further includes a seventh transistor T7 for implementing the second light emission control circuit 600. The other structures of the pixel circuit 10 shown in FIG. 6B are the same as those of the pixel circuit 10 shown in FIG. 3B, and the details will not be described here.

For example, the transistors T1, T2, T3, T4 and T7 above may all be N-type thin film transistors, wherein the transistors T1, T2, T3, T4 and T7 may all be N-type oxide thin film transistors. When an N-type oxide thin film transistor is adopted, Indium Gallium Zinc Oxide (IGZO) can be used as the material of the active layer of the thin film transistor, so that the size of the transistor can be effectively reduced and the leakage current can be avoided as compared with the case of using Low Temperature Poly Silicon (LTPS) or amorphous silicon (such as hydrogenated amorphous silicon) as the material of the active layer of the thin film transistor.

For example, as shown in FIG. 6B, the second light emission control circuit 600 may be implemented as a seventh transistor T7, wherein the seventh transistor T7 is an N-type thin film transistor, such as an N-type oxide thin film transistor. A gate electrode of the seventh transistor T7 is connected to a second light emission control terminal to receive the second light emission control signal EM2, a first electrode of the seventh transistor T7 is connected to the second node N2 (the second terminal 120 of the driving circuit 100), and a second electrode of the seventh transistor T7 is connected to the first electrode of the light-emitting element EL.

Figure 7B:
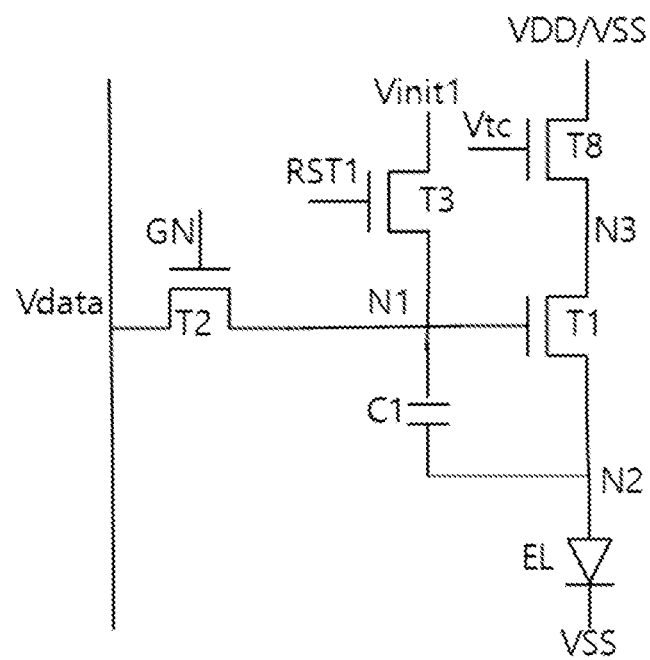
FIG. 7B is a schematic circuit structure diagram of a specific implementation example of the pixel circuit shown in FIG. 7A.

FIG. 7B is a schematic circuit structure diagram of a specific example of the pixel circuit shown in FIG. 7A. As shown in FIG. 7B, the pixel circuit 10 includes transistors T1, T2, T3 and T8, a storage capacitor C1 and a light-emitting element LE. The pixel circuit 10 shown in FIG. 7B is different from the pixel circuit 10 shown in FIG. 2B in that the pixel circuit 10 shown in FIG. 7B further includes an eighth transistor T8 for implementing the voltage transmission circuit 800. The other structures of the pixel circuit 10 shown in FIG. 7B are the same as those of the pixel circuit 10 shown in FIG. 2B, and the details will not be described here.

For example, the above transistors T1, T2, T3, and T8 above may all be N-type thin film transistors, wherein the transistors T1 T2, T3, and T8 may all be N-type oxide thin film transistors. When an N-type oxide thin film transistor is adopted, Indium Gallium Zinc Oxide (IGZO) can be used as the material of the active layer of the thin film transistor, so that the size of the transistor can be effectively reduced and the leakage current can be avoided as compared with the case of using Low Temperature Poly Silicon (LTPS) or amorphous silicon (such as hydrogenated amorphous silicon) as the material of the active layer of the thin film transistor.

For example, as shown in FIG. 7B, the voltage transmission circuit 800 may be implemented as an eighth transistor T8, wherein the eighth transistor T8 is an N-type thin film transistor, such as an N-type oxide thin film transistor. A gate electrode of the eighth transistor T8 is connected to a voltage transmission control signal terminal to receive the voltage transmission control signal Vtc, a first electrode of the eighth transistor T8 is connected to the first power supply terminal, and a second electrode of the eighth transistor T8 is connected to the third node N3 (the first terminal 110 of the driving circuit 100). The first power supply terminal is configured to transmit a second power supply voltage, such as VSS, to the first terminal 110 of the driving circuit 100 in a first time period, and to transmit a first power supply voltage, such as VDD, different from the second power supply voltage to the first terminal 110 of the driving circuit 100 in a second time period.

Figure 8B:
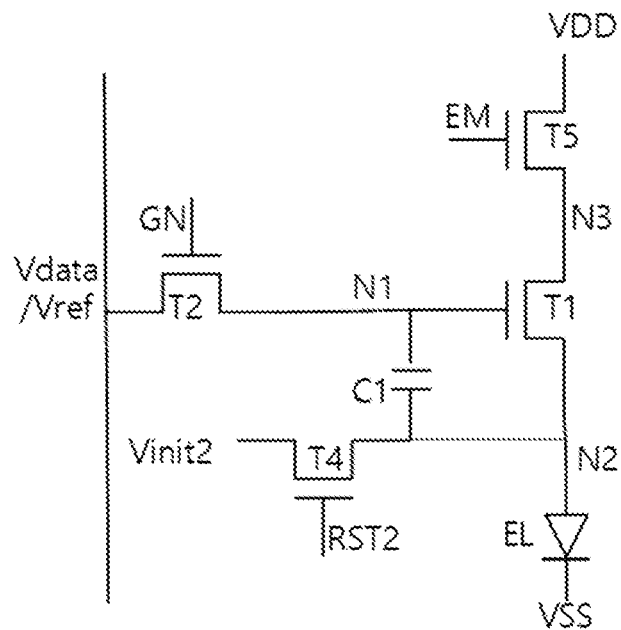
FIG. 8B is a schematic circuit structure diagram of a specific implementation example of the pixel circuit shown in FIG. 8A.

FIG. 8B is a schematic circuit structure diagram of a specific example of the pixel circuit shown in FIG. 8A. As shown in FIG. 8B, the pixel circuit 10 includes transistors T1, T2, T4 and T5, a storage capacitor C1 and a light-emitting element LE. The pixel circuit 10 shown in FIG. 8B is different from the pixel circuit 10 shown in FIG. 3B in that the pixel circuit 10 shown in FIG. 8B does not include the third transistor T3 for implementing the first reset circuit 410. The other structures of the pixel circuit 10 shown in FIG. 8B are the same as those of the pixel circuit 10 shown in FIG. 3B, and the details will not be described here.

For example, the above transistors T1, T2, T4, and T5 above may all be N-type thin film transistors, such as N-type oxide thin film transistors.

For example, as shown in FIGS. 8A and 8B, in some embodiments, in a first time period, the data signal terminal transmits a reference voltage Vref, such as the first initialization voltage Vinit1, to the first electrode of the second transistor T2, and transmits the first initialization voltage Vinit1 to the control terminal 130 of the driving circuit 100 after the second transistor T2 is turned on in response to the gate scanning signal GN, so that the initialization of the control terminal 130 of the driving circuit 100 is completed; and in a second period, the data signal terminal transmits the data signal Vdata to the first terminal of the data writing circuit 200, and writes the data signal Vdata into the control terminal 130 of the driving circuit 100 and stores the same in the storage circuit 300 after the second transistor T2 is turned on in response to the gate scanning signal GN, so that the driving circuit 100 can generate a corresponding driving current according to the intensity of the data signal Vdata in the light emission stage to drive the light-emitting element 700 to emit light.

It should be noted that in the embodiments of the present disclosure, the storage capacitor Cst can be a capacitor component fabricated by a technological process, for example, by fabricating electrodes specialized for the capacitor, each electrode of the capacitor can be implemented as a metal layer, a semiconductor layer (e.g., doped polysilicon), etc., and the capacitor can also partially be a parasitic capacitor between various components and can be implemented as the transistor itself and other components and circuitries. The connection mode of the capacitor is not limited to those described above, but other suitable connection modes can also be adopted, as long as the level of the corresponding node can be stored.

It should be noted that, in the description of the embodiment of the present disclosure, the first node N1, the second node N2 and the third node N3 do not represent actual components, but represent intersection points of related electric connections in the circuit diagram.

It should be noted that all of the transistors adopted in the embodiments of the present disclosure can be thin film transistors, field effect transistors or other switching devices with the same characteristics, and all of the embodiments of the present disclosure are described with reference to the case of thin film transistors by way of example. A source electrode and a drain electrode of the transistor as used here can be symmetrical in their structures, so there can be no difference in structure between the source electrode and the drain electrode. In the embodiments of the present disclosure, in order to distinguish the two electrodes of the transistor except the gate electrode, one of them is directly described as the first electrode and the other is described as the second electrode.

In addition, the transistors in the embodiments of the present disclosure are all described with reference to an N-type transistor by way of example. In such case, the first electrode of the transistor is a drain electrode and the second electrode is a source electrode. When an N-type oxide thin film transistor is adopted, Indium Gallium Zinc Oxide (IGZO) can be used as the material of the active layer of the thin film transistor, so that the size of the transistor can be effectively reduced and the leakage current can be avoided as compared with the case of using Low Temperature Poly Silicon (LTPS) or amorphous silicon (such as hydrogenated amorphous silicon) as the material of the active layer of the thin film transistor.

It should be noted that the embodiments of the present disclosure are all described with reference to the case where a cathode (e.g., a common cathode of a plurality of light-emitting elements) of the light-emitting element LE is applied with a second power supply voltage VSS (low voltage) by way of example, and the embodiments of the present disclosure include such case but are not limited thereto. For example, it's also possible that an anode of the light-emitting element LE is applied with a first power supply voltage VDD (high voltage), while the cathode thereof is directly or indirectly connected to the driving circuit, for example, reference may be made to the 2T1C pixel circuit shown in FIG. 1B.

It should be noted that in the pixel circuit provided by the embodiments of the present disclosure, an "effective level" refers to a level at which a transistor under operation included in the pixel circuit can be turned on, and correspondingly, an "invalid level" refers to a level at which the transistor under operation included in the pixel circuit cannot be turned on (that is, the transistor is turned off). The effective level can be higher or lower than the invalid level, depending on factors such as the type of the transistor (e.g., N type) in the circuit structure of the shift register unit. For example, in the embodiments of the present disclosure, when all the transistors are N-type transistors, the effective level is a high level and the invalid level is a low level.

Figure 2C:
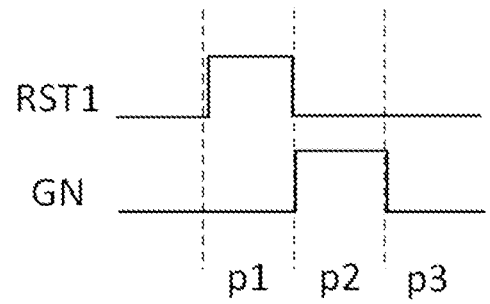
FIG. 2C is a signal timing diagram of a driving method of the pixel circuit shown in FIG. 2B.

At least some embodiments of the present disclosure further provide a driving method of a pixel circuit. FIG. 2C is a signal timing diagram of a driving method of a pixel circuit provided by at least some embodiments of the present disclosure. In conjunction with the signal timing diagram shown in FIG. 2C, the working principle of the pixel circuit shown in FIG. 2A will be explained below with reference to the case where the pixel circuit shown in FIG. 2A is particularly implemented as the pixel circuit structure shown in FIG. 2B by way of example. It should be noted that the voltage level of the signal timing diagram shown in FIG. 2C is only schematic and is not intended to represent the real voltage value or relative proportion. As for the embodiments of the present disclosure, a high-voltage signal corresponds to a turn-on signal of the N-type transistor, while a low-voltage signal corresponds to a turn-off signal of the N-type transistor.

For example, as shown in FIG. 2C, the driving method provided by the present embodiment may include three stages, namely, an initialization stage p1, a data writing stage p2, and a light emission stage p3, and time sequence waveforms of various signals in each stage are shown in FIG. 2C.

In the initialization stage p1, the first reset control signal RST1 is input, the first reset circuit 410 is switched on (i.e., turned on), and the control terminal 130 of the driving circuit 100 is reset through the first reset circuit 410. For example, in the initialization phase p1, the third transistor T3 is turned on by the high voltage of the first reset control signal RST1, so that the first node N1 is initialized, and the initialization voltage is Vinit1. For example, Vinit1 is a low voltage (for example, it can be a grounded voltage or other low voltages), and the voltage of the gate electrode of the first transistor T1 (i.e., the first node N1) becomes Vinit1, so that the first transistor T1 is in a turn-off state to bring the light-emitting device EL into a non-light emission state. For example, the third transistor T3 may be an oxide thin film transistor to reduce low-frequency leakage, so that the first node N1 remains at a low voltage, which allows the first transistor T1 to stay in the turn-off state for a long time, and hence allows the light-emitting device EL to stay in the non-light emission state for a long time, thereby eliminating the flicker. At the same time, the second transistor T2 is turned off by the low voltage of the gate scanning signal GN, which prevents from the input of the data signal Vdata.

In the data writing stage p2, the gate scanning signal GN is input, the data writing circuit 200 is turned on, the data signal Vdata is written into the control terminal 130 of the driving circuit 100 through the data writing circuit 200, and the data signal Vdata as written in is stored through the storage circuit 300. For example, in the data writing stage, the first reset control signal RST1 becomes a low voltage so that the third transistor T3 is turned off, while the gate scanning signal GN becomes a high voltage so that the second transistor T2 is turned on. At this time, the voltage at the first node N1 is changed from the first initialization voltage Vinit1 to a higher voltage, i.e., the data voltage Vdata (the voltage of the data signal Vdata), so that the first transistor T1 is turned on. At the same time, because the voltage at the first node N1 becomes the data voltage Vdata, the data voltage Vdata can be stored in the storage capacitor C1, and the data writing is completed.

It should be noted that in the data writing stage p2, because the first transistor T1 is turned on, the leakage current Ids flows from the third node N3 to the second node N2, and the voltage at the second node N2 gradually rises.

In the light emission stage p3, the input of the gate scanning signal GN is stopped, the data writing circuit 200 is turned off, and a driving current is generated by the driving circuit 100 under the control of the data signal Vdata stored in the storage circuit 300, so that the light-emitting element 700 emits light. For example, in the light emission stage p3, the first reset control signal RST1 becomes a low voltage, so that the third transistor T3 is turned off; and at the same time, the second transistor T2 is turned off by the low voltage of the gate scanning signal GN, which prevents from the input of the data voltage Vdata. At this time, the first transistor T1 remains in a turn-on state under the control of the data signal Vdata stored in the storage capacitor C1, the voltage at the second node N2 rises to exceed the turn-on voltage of the light-emitting device EL, and the light-emitting device EL starts to emit light; because it is driven by a constant current, the voltage at the second node N2 finally will reach the turn-on voltage of the light-emitting device; and at the same time, because the first node N1 and the second node N2 are connected through the first capacitor C1, the voltage at the first node N1 also rises to a stable state along with the voltage at the second node N2; even if the voltages at the two nodes N1 and N2 are changed, the voltage difference between the two nodes N1 and N2, that is, the voltage difference Vgs between the gate electrode and the source electrode of the first transistor T1, can remain unchanged; as a result, a luminous current I is constant, as described in the following formula: $I=k\mu(Vdata-\Delta V)^2$, wherein I is the luminous current, k is a constant coefficient, $\mu$ is a mobility of the first transistor T1, Vdata is the data signal voltage, and $\Delta V$ is a gradually risen value of the voltage at the second node N2.

Figure 3C:
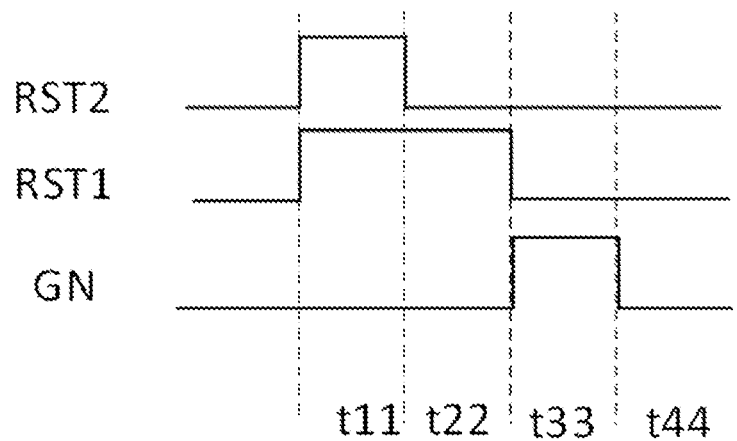
FIG. 3C is a signal timing diagram of a driving method of the pixel circuit shown in FIG. 3B.

At least some embodiments of the present disclosure further provide a driving method of a pixel circuit. FIG. 3C is a signal timing diagram of a driving method of a pixel circuit provided by at least some embodiments of the present disclosure. In conjunction with the signal timing diagram shown in FIG. 3C, the working principle of the pixel circuit shown in FIG. 3A will be explained below with reference to the case where the pixel circuit shown in FIG. 3A is particularly implemented as the pixel circuit structure shown in FIG. 3B by way of example.

For example, as shown in FIG. 3C, the driving method provided by the present embodiment may include four stages, namely, an initialization stage t11, a threshold voltage compensation stage t22, a data writing and mobility compensation stage t33, and a light emission stage t44, and the time sequence waveforms of various signals in each stage are shown in FIG. 3C.

In the initialization stage t11, the first reset control signal RST1 and the second reset control signal RST2 are input, the first reset circuit 410 and the second reset circuit 420 are switched on (i.e., turned on), the control terminal 130 of the driving circuit 100 is reset by the first reset circuit 410, and the second terminal 120 of the driving circuit 100 is reset by the second reset circuit 420. For example, in the initialization stage t11, the third transistor T3 is turned on by the high voltage of the first reset control signal RST1, so that the first node N1 is initialized, and the initialization voltage is Vinit1. Because Vinit1 is a high voltage (for example, it can be a first power supply voltage, such as VDD or other high voltages), the voltage of the gate electrode of the first transistor T1 (that is, the first node N1) becomes Vinit1. For example, in the initialization stage t11, the fourth transistor T4 is turned on by the high voltage of the second reset control signal RST2, so that the second node N2 is initialized, and the initialization voltage is Vinit2. For example, Vinit2 can be a low voltage (for example, it can be a grounded voltage or other low voltages). For example, the voltage of Vinit2 can be smaller than the second power supply voltage (for example, VSS), so that the voltage difference Vgs between the gate electrode and the source electrode of the first transistor T1 is large enough (for example, greater than 7 V), thereby quickly eliminating the hysteresis state. At the same time, because Vinit2 can be a low voltage, the second node N2 connected to the second electrode of the fourth transistor T4 is also at a low voltage after the fourth transistor T4 is turned on, so that the light-emitting device EL is in a non-light emission state. For example, the third transistor T3 can be an oxide thin film transistor to reduce the low-frequency leakage, so that the first node N1 remains at a low voltage, which allows the first transistor T1 to stay in the turn-off state for a long time, and then allows the light-emitting device EL to stay in the non-light emission state for a long time, thereby eliminating the flicker. At the same time, the second transistor T2 is turned off by the low voltage of the gate scanning signal GN, which prevents from the input of the data signal Vdata.

In the threshold voltage compensation stage t22, the first reset control signal RST1 is input, the first reset circuit 410 is turned on, and the first initialization voltage Vinit1 is applied to the control terminal 130 of the driving circuit 100 through the first reset circuit 410 to turn on the driving circuit 100; at the same time, the input of the second reset control signal is stopped, and the second reset circuit 420 is turned off; therefore, a threshold compensation can be performed through the turned-on driving circuit 100 and the storage circuit 300. For example, the first reset control signal RST1 can remains at a high voltage, so that the third transistor T3 remains in the turn-on state; the second reset control signal RST2 may be a low voltage, so that the fourth transistor T4 is turned off. The second transistor T2 is continuously turned off by the low voltage of the gate scanning signal GN, which continuously prevents from the input of the data signal Vdata. At the same time, the voltage at the first node N1 (i.e., the first initialization voltage Vinit1) is a high voltage, and the first transistor T1 is turned on. Because the voltage VDD at the third node N3 is a high voltage, the voltage at the second node N2 gradually rises from the initial VSS, until the voltage difference Vgs between the gate electrode and the source electrode (e.g., the second electrode) of the first transistor T1 is equal to the threshold voltage Vth of the first transistor T1; at this time, the voltage $V_{N2}$ at the second node N2 is the difference value between the first initialization voltage Vinit1 and the threshold voltage Vth of the first transistor T1; and at the same time, the threshold voltage Vth of the first transistor T1 is written into both terminals of the storage capacitor C1, then the threshold voltage compensation is completed, as described in the following formula: VN2=Vinit1−Vth, wherein VN2 is the voltage at the second node N2, Vinit1 is the first initialization voltage, and Vth is the threshold voltage of the first transistor T1.

In the data writing and mobility compensation stage t33, the gate scanning signal GN is input, the data writing circuit 200 is turned on, the data signal Vdata is written into the control terminal 130 of the driving circuit 100 through the data writing circuit 200, and the data signal Vdata as written in is stored through the storage circuit 300. For example, the first reset control signal RST1 becomes a low voltage, so that the third transistor T3 is turned off; the second reset control signal RST2 may be a low voltage so that the fourth transistor T4 is turned off, while the gate scanning signal GN becomes a high voltage so that the second transistor T2 is turned on. At this time, the voltage at the first node N1 is changed from the first initialization voltage Vinit1 to the data voltage Vdata (the voltage of the data signal Vdata), so that the first transistor T1 is turned on. At the same time, because the voltage at the first node N1 becomes the data voltage Vdata, the data voltage Vdata can be stored through the storage capacitor C1, then the data writing is completed. Because the light-emitting device EL connected to the second node N2 can be considered as a capacitor having a capacitance value much larger than that of the first capacitor C1, the voltage at the second node N2 is almost unchanged and remains as the difference value between the first initialization voltage Vinit1 and the threshold voltage Vth of the first transistor T1 in the previous stage t22. As the first transistor T1 is turned on, the driving current Ids thereof flows from the third node N3 to the second node N2, and the voltage at the second node N2 gradually rises by ΔV; at this time, the voltage VN2 at N2 is the sum of the gradually risen voltage ΔV plus the difference value between the first initialization voltage Vinit1 and the threshold voltage Vth of the first transistor T1, as described in the following formula: VN2=Vinit1−Vth+ΔV, wherein VN2 is the voltage at the second node N2, Vinit1 is the first initialization voltage, Vth is the threshold voltage of the first transistor T1, and ΔV is the gradually risen value of the voltage at the second node N2.

The voltage at the first node N1 still is the data voltage Vdata due to the turn-on state of the second transistor T2. The driving current of the first transistor T1 is described as follows: Ids=kμ(Vgs−Vth)$^2$, wherein Ids is the driving current of the first transistor T1, k is a constant coefficient, μ is the mobility of the first transistor T1, Vgs is the voltage difference between the gate electrode and the source electrode of the first transistor T1, and Vth is the threshold voltage of the first transistor T1. As can be seen from the above formula, the greater the mobility 11 of the first transistor T1, the greater the driving current of the first transistor T1 and also the greater the gradually risen voltage ΔV of the second node N2, and correspondingly, the smaller the voltage difference between the gate electrode and the source electrode of the first transistor T1 and also the smaller the value of (Vgs−vth)$^2$; as a result, the driving current Ids of the first transistor T1 is corrected. For example, the driving current of driving transistors with different mobility values has little difference under the same data voltage Vdata.

In the light emission stage t44, the input of the gate scanning signal GN is stopped, the data writing circuit 200 is turned off, and a driving current is generated by the driving circuit 100 under the control of the data signal Vdata stored in the storage circuit 300, so that the light-emitting element 700 emits light. For example, the first reset control signal RST1 becomes a low voltage, so that the third transistor T3 is turned off; the second reset control signal RST2 may be at a low voltage, so that the fourth transistor T4 is turned off. At the same time, the second transistor T2 is turned off by the low voltage of the gate scanning signal GN, which prevents from the input of the data voltage Vdata. At this time, the voltage at the second node N2 rises to exceed the turn-on voltage of the light-emitting device EL, and the light-emitting device EL starts to emit light; because it is driven by a constant current, the voltage at the second node N2 will finally reach the turn-on voltage of the light-emitting device; and at the same time, because the first node N1 is connected to the second node N2 through the first capacitor C1, the voltage at the first node N1 also rises to a stable state along with the voltage at the second node N2; even if the voltages at the two nodes N1 and N2 are changed, the voltage difference between the two nodes N1 and N2, that is, the voltage difference Vgs between the gate electrode and the source electrode of the first transistor T1, can remain unchanged; as a result, the luminous current I is constant, as described in the following formula: I=kμ(Vdata−ΔV)$^2$, wherein I is the luminous current, k is a constant coefficient, μ is the mobility of the first transistor T1, Vdata is the data signal voltage, and ΔV is the gradually risen value of the voltage at the second node N2. Therefore, the pixel circuit achieves the technical effects of threshold voltage compensation, mobility (II) compensation and voltage drop (IR Drop) compensation at the same time.

For example, in order to simplify the circuit, the second reset control signal RST2 and the gate scanning signal GN as described above can share a set of GOA circuits, which is beneficial to simplifying the wiring layout of the display screen, improving the resolution, and realizing a narrow bezel, etc.

Figure 6C:
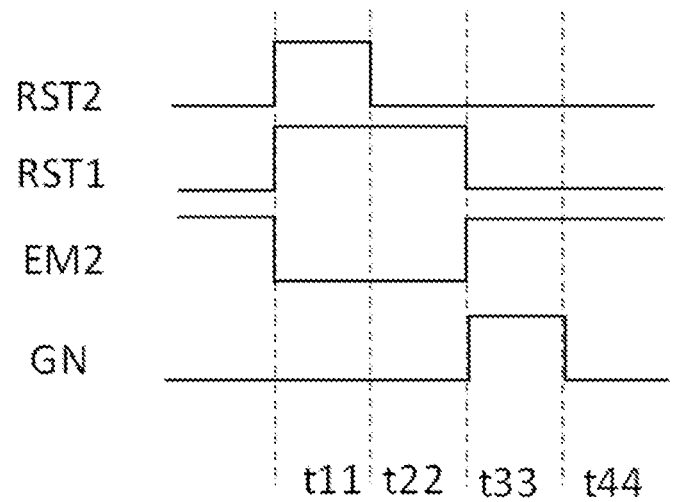
FIG. 6C is a signal timing diagram of a driving method of the pixel circuit shown in FIG. 6B.

At least some embodiments of the present disclosure further provide a driving method of a pixel circuit. FIG. 6C is a signal timing diagram of a driving method of a pixel circuit provided by at least some embodiments of the present disclosure. The pixel circuit driving method disclosed in FIG. 6C is almost the same as that disclosed in FIG. 3C. In conjunction with the signal timing diagram shown in FIG. 6C, the working principle of the pixel circuit shown in FIG. 6A will be explained below with reference to the case where the pixel circuit shown in FIG. 6A is particularly implemented as the pixel circuit shown in FIG. 6B by way of example.

For example, as shown in FIG. 6C, the driving method provided by the present embodiment may include four stages, namely, an initialization stage t11, a threshold voltage compensation stage t22, a data writing and mobility compensation stage t33, and a light emission stage t44. FIG. 6C shows the time sequence waveforms of various signals in each stage.

For example, the pixel circuit 10 shown in FIG. 6B corresponding to the signal timing diagram of the pixel circuit driving method shown in FIG. 6C is different from the pixel circuit 10 shown in FIG. 3B corresponding to the signal timing diagram of the pixel circuit driving method shown in FIG. 3C in that a seventh transistor T7 for implementing the second light emission control circuit 600 is added to the pixel circuit 10 shown in FIG. 6B. For example, the light-emitting device EL is connected to the second node N2 through the seventh transistor T7, so that the drain electrode (e.g., the first electrode) of the first transistor T1 always stays at the first power supply voltage, which can be, for example, VDD. Moreover, because the voltage difference Vgd between the gate electrode and the drain electrode of the first transistor T1 is always smaller than the threshold voltage Vth of the first transistor T1, the first transistor T1 is either in a turn-off state or in a saturated state, which is beneficial to stabilizing the characteristics of the first transistor T1.

For example, the value of the second initialization voltage Vinit2 may be smaller than the value of the second power supply voltage (e.g., VSS), so that the voltage difference Vgs between the gate electrode and the source electrode of the first transistor T1 is large enough (e.g., greater than 7V) to eliminate the hysteresis state quickly. However, because the voltage at the second node N2 is the second initialization voltage Vinit2, the light-emitting device EL is in a reverse-biased state. When the reverse-biased voltage is large enough, there is reverse-biased driving current in the light-emitting device EL, which results in long-term adverse effect to the light-emitting device EL. Therefore, the existence of the seventh transistor T7 avoids the generation of the reverse-biased driving current, and at the same time, the second initialization voltage Vinit2 can be made low enough (for example, lower than the second power supply voltage) to eliminate the hysteresis as soon as possible.

In the initialization stage t11, as shown in FIG. 6C, the driving method provided by the present embodiment is different from the driving method shown in FIG. 3C in that the second light emission control signal EM2 is at a low voltage and the seventh transistor T7 is turned off.

In the threshold voltage compensation stage t22, as shown in FIG. 6C, the driving method provided by the present embodiment is different from the driving method shown in FIG. 3C in that the second light emission control signal EM2 is at a low voltage and the seventh transistor T7 is turned off.

For example, in the data writing and mobility compensation stage t33, as shown in FIG. 6C, the driving method provided by the present embodiment is different from the driving method shown in FIG. 3C in that the second light emission control signal EM2 is at a high voltage and the seventh transistor T7 is turned on.

For example, in the light emission stage t44, as shown in FIG. 6C, the driving method provided by the present embodiment is different from the driving method shown in FIG. 3C in that the second light emission control signal EM2 is at a high voltage and the seventh transistor T7 is turned on.

For example, according to FIG. 6C, in order to simplify the circuit, the second reset control signal RST2 and the gate scanning signal GN can share a set of GOA circuits, and the first reset control signal RST1 and the second light emission control signal EM2 can also share a set of GOA circuits. For example, an inverter can be added to generate a pair of signals including the first reset control signal RST1 and the second light emission control signal EM2. Therefore, the pixel circuit shown in FIG. 6B corresponding to the timing diagram shown in FIG. 6C only needs two sets of GOA circuits for normal operation, which is beneficial to simplifying the wiring layout of the display screen, improving the resolution, and realizing a narrow bezel.

Figure 4C:
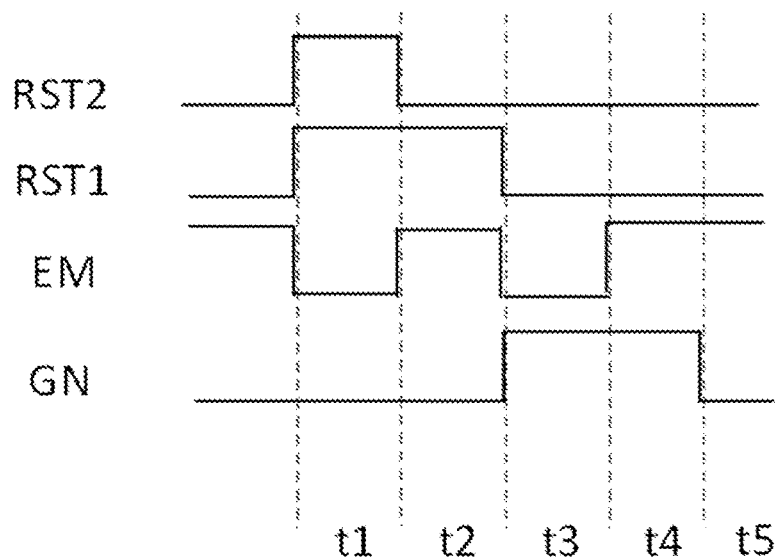
FIG. 4C is a signal timing diagram of a driving method of the pixel circuit shown in FIG. 4B.

At least some embodiments of the present disclosure further provide a driving method of a pixel circuit. FIG. 4C is a signal timing diagram of a driving method of a pixel circuit provided by at least some embodiments of the present disclosure. In conjunction with the signal timing diagram shown in FIG. 4C, the working principle of the pixel circuit shown in FIG. 4A will be explained below with reference to the case where the pixel circuit shown in FIG. 4A is particularly implemented as the pixel circuit structure as shown in FIG. 4B by way of example.

For example, as shown in FIG. 4C, the driving method provided by the present embodiment may include five stages, namely, an initialization stage t1, a threshold voltage compensation stage t2, a data writing stage t3, a mobility compensation stage t4, and a light emission stage t5, and the time sequence waveforms of various signals in each stage are shown in FIG. 4C.

In the initialization stage t1, the first reset control signal RST1 and the second reset control signal RST2 are input, the first reset circuit 410 and the second reset circuit 420 are switched on (i.e., turned on), and the second terminal 120 of the driving circuit 100 is reset through the second reset circuit 420. For example, in the initialization stage t1, the third transistor T3 is turned on by the high voltage of the first reset control signal RST1, so that the first node N1 (the control terminal 130 of the driving circuit 100) is initialized, and the initialization voltage is Vinit1. Because the Vinit1 is a high voltage (for example, it can be a first power supply voltage, such as VDD or other high voltages), the voltage of the gate electrode of the first transistor T1 (that is, the first node N1) becomes Vinit1. For example, in the initialization stage t1, the fourth transistor T4 is turned on by the high voltage of the second reset control signal RST2, so that the second node N2 (the second terminal 120 of the driving circuit 100) is initialized, and the initialization voltage is Vinit2. For example, Vinit2 can be a low voltage (for example, it can be a grounded voltage or other low voltages); for example, the voltage of Vinit2 can be smaller than the second power supply voltage (for example, VSS), so that the voltage difference Vgs between the gate electrode and the source electrode of the first transistor T1 is large enough (for example, greater than 7V) to eliminate the hysteresis state quickly; and because the voltage difference Vgd between the gate electrode and the drain electrode of the first transistor T1 is equal to the difference value between Vinit1 and VDD and is smaller than Vth, the first transistor T1 is either in a turn-off state or in a saturated state, which is beneficial to stabilizing the characteristics of the first transistor T1. At the same time, the fifth transistor T5 is turned off by the low voltage of the first light emission control signal EM1, which prevents from the input of the first power supply voltage; because Vinit2 can be a low voltage, the second node N2 connected to the second electrode of the fourth transistor T4 is also a low voltage after the fourth transistor T4 is turned on, so that the light-emitting device EL is in a non- light emission state. For example, the third transistor T3 can be an oxide thin film transistor to reduce the low-frequency leakage, so that the first node N1 remains at a low voltage, which allows the first transistor T1 to stay in the turn-off state for a long time, and hence allows the light-emitting device EL to stay in the non-light emission state for a long time, thereby eliminating the flicker. At the same time, the second transistor T2 is turned off by the low voltage of the gate scanning signal GN, which prevents from the input of the data signal Vdata.

In the threshold voltage compensation stage t2, the first reset control signal RST1 is input, the first reset circuit 410 is turned on, the first initialization voltage Vinit1 is applied to the control terminal 130 of the driving circuit 100 through the first reset circuit 410 to turn on the driving circuit 100, the first light emission control signal is input, and the first light emission control circuit 500 is turned on; at the same time, the input of the second reset control signal is stopped, and the second reset circuit 420 is turned off, so that the threshold voltage of the driving circuit 100 can be compensated through the turned-on driving circuit 100 and the storage circuit 300. For example, the first reset control signal RST1 remains at a high voltage, so that the third transistor T3 remains turned on, which allows the voltage at the first node N1 to remain as the first initialization voltage Vinit1, for example, a high voltage. The second reset control signal RST2 is at a low voltage, so that the fourth transistor T4 is turned off. At this time, the voltage at the first node N1, i.e., the first initialization voltage Vinit1, is a high voltage, for example, higher than VDD, and the voltage at the third node N3 is a high voltage, for example, VDD. The first light emission control signal EM1 can be at a high voltage, so that the fifth transistor T5 is turned on, and the voltage at the second node N2 gradually rises from the initial, second initialization voltage Vinit2, until the voltage difference Vgs between the gate electrode and the source electrode of the first transistor T1 is equal to the threshold voltage Vth of the first transistor T1, at which time the voltage at the second node N2 is the difference value between the first initialization voltage Vinit1 and the threshold voltage Vth of the first transistor T1; in this way, the threshold voltage Vth of the first transistor T1 is written to both terminals of the first capacitor C1. Because the light-emitting device EL connected to the second node N2 can be considered as a capacitor with a capacitance value much greater than that of the first capacitor C1, the voltage at the second node N2 is almost unchanged and remains as the difference value between the first initialization voltage Vinit1 and the threshold voltage Vth of the first transistor T1 in the previous stage t2; in this way, the threshold voltage Vth of the first transistor T1 is compensated, and the threshold voltage compensation is completed. At the same time, the second transistor T2 is turned off by the low voltage of the gate scanning signal GN, which prevents from the input of the data signal Vdata.

In the data writing stage t3, the gate scanning signal GN is input, the data writing circuit 200 is turned on, the data signal Vdata is written into the control terminal 130 of the driving circuit 100 through the data writing circuit 200, and the data signal Vdata as written in is stored through the storage circuit 300. For example, in the data writing stage t3, the first light emission control signal EM1 may be at a low voltage, so that the fifth transistor T5 is turned off. The first reset control signal RST1 is at a low voltage, so that the third transistor T3 is turned off. The second reset control signal RST2 is at a low voltage, so that the fourth transistor T4 is turned off. At the same time, the second transistor T2 is turned on by the high voltage of the gate scanning signal GN. At this time, the voltage at the first node N1 is changed from the first initialization voltage Vinit1 to a higher voltage, for example, Vdata, that is, the data voltage Vdata (the voltage of the data signal Vdata), so that the first transistor T1 is turned on. At the same time, because the voltage at the first node N1 becomes the data voltage Vdata, the data voltage Vdata can be stored through the storage capacitor C1, and the data writing is completed.

In the mobility compensation stage t4, the input of the first reset control signal RST1 is stopped, the first reset circuit 410 is turned off, the input of the second reset control signal is stopped, the second reset circuit 420 is turned off, the gate scanning signal GN is input, the data writing circuit 200 is turned on, the first light emission control signal is input, and the first light emission control circuit 500 is turned on, so that the mobility compensation can be performed through the turned-on first light emission control circuit 500 and the turned-on data writing circuit 200. For example, in the mobility compensation stage t4, the first light emission control signal EM1 may be at a high voltage, so that the fifth transistor T5 is turned on. The second reset control signal RST2 is at a low voltage, so that the fourth transistor T4 is turned off. The first reset control signal RST1 is at a low voltage, so that the third transistor T3 is turned off. The gate scanning signal GN remains at a high voltage, so that the second transistor T2 remains turned on. At this time, the first transistor T1 is turned on, and the leakage current Ids flows from the first power supply voltage terminal, for example, the VDD terminal, to the second node N2, and the voltage at the second node N2 gradually rises by $\Delta V$; at this time, the voltage VN2 at N2 is the sum of the gradually risen voltage $\Delta V$ plus the difference value between the first initialization voltage Vinit1 and the threshold voltage Vth of the first transistor T1, as described in the following formula: VN2=Vinit1−Vth+$\Delta V$, wherein VN2 is the voltage at the second node N2, Vinit1 is the first initialization voltage, Vth is the threshold voltage of the first transistor T1, and $\Delta V$ is the gradually risen value of the voltage at the second node N2. The voltage at the first node N1 still is the data voltage Vdata due to the turn-on state of the second transistor T2. The driving current of the first transistor T1 is described as the following formula: Ids=k$\mu$(Vgs−Vth)$^2$, wherein Ids is the drain current of the first transistor T1, k is a constant coefficient, $\mu$ is the mobility of the first transistor T1, Vgs is the voltage difference between the gate electrode and the source electrode of the first transistor T1, and Vth is the threshold voltage of the first transistor T1. As can be seen from the above formula, the greater the mobility 11 of the first transistor T1, the greater the driving current of the first transistor T1 and also the greater the gradually risen voltage ΔV of the second node N2, and correspondingly, the smaller the voltage difference between the gate electrode and the source electrode of the first transistor T1 and also the smaller the value of (Vgs−vth)$^2$; as a result, the drain current Ids of the first transistor T1 is corrected. For example, the driving current of driving transistors with different mobility values has little difference under the same data voltage Vdata.

In the light emission stage t5, the input of the first reset control signal RST1 is stopped, the first reset circuit 410 is turned off, the input of the second reset control signal is stopped, the second reset circuit 420 is turned off, the input of the gate scanning signal GN is stopped, the data writing circuit 200 is turned off, the first light emission control signal is input, and the first light emission control circuit 500 is turned on, so that the first power supply voltage can drive the light-emitting element to emit light through the turned-on first light emission control circuit 500 and the turned-on driving circuit 100. For example, in the light emission stage t5, the first light emission control signal EM1 may be at a high voltage, so that the fifth transistor t5 is turned on. The first reset control signal RST1 is at a low voltage, so that the third transistor T3 is turned off. The second reset control signal RST2 is at a low voltage, so that the fourth transistor T4 is turned off. The gate scanning signal GN is at a low voltage, so that the second transistor T2 is turned off. At this time, the voltage at the second node N2 rises to exceed the turn-on voltage of the light-emitting device EL, and the light-emitting device EL starts to emit light; because it is driven by a constant current, the voltage at the second node N2 will finally reach the turn-on voltage of the light-emitting device; at the same time, because the first node N1 is connected to the second node N2 through the first capacitor C1, the voltage at the first node N1 also rises to a stable state along with the voltage at the second node N2; even if the voltages of the two nodes N1 and N2 are changed, the voltage difference between the two nodes N1 and N2, that is, the voltage difference Vgs between the gate electrode and the source electrode of the first transistor T1, can remain unchanged, so the luminous current I is constant, as described in the following formula: I=kμ(Vdata−ΔV)$^2$, wherein I is the luminous current, k is a constant coefficient, μ is the mobility of the first transistor T1, Vdata is the data signal voltage, and ΔV is the gradually risen value of the voltage at the second node N2. Therefore, the pixel circuit achieves the technical effects of threshold voltage compensation, mobility (t) compensation and voltage drop (IR Drop) compensation at the same time.

For example, in the pixel circuit described above, the third transistor T3 connected to the first node N1 may be replaced with a thin film transistor with lower leakage current, such as an oxide thin film transistor to reduce the low-frequency leakage, so that the voltage at the first node N1 is maintained, and no flicker occurs when the light-emitting device EL emits light.

At least some embodiments of the present disclosure further provide a driving method of a pixel circuit. FIG. 5C is a signal timing diagram of a driving method of a pixel circuit provided by at least some embodiments of the present disclosure. The pixel circuit driving method disclosed in FIG. 5C is almost the same as the pixel circuit driving method disclosed in FIG. 4C. In conjunction with the signal timing diagram shown in FIG. 5C, the working principle of the pixel circuit shown in FIG. 5A will be explained below with reference to the case where the pixel circuit shown in FIG. 5A is particularly implemented as the pixel circuit structure shown in FIG. 5B by way of example.

For example, as shown in FIG. 5C, the driving method provided by the present embodiment may include five stages, namely, an initialization stage t1, a threshold voltage compensation stage t2, a data writing stage t3, a mobility compensation stage t4, and a light emission stage t5, and the time sequence waveforms of various signals in each stage are shown in FIG. 5C.

For example, the pixel circuit 10 shown in FIG. 5B corresponding to the signal timing diagram of the pixel circuit driving method shown in FIG. 5C is different from the pixel circuit 10 shown in FIG. 4B corresponding to the signal timing diagram of the pixel circuit driving method shown in FIG. 4C in that a sixth transistor T6 for implementing the third reset control circuit 430 is added to the pixel circuit 10 shown in FIG. 5B. For example, a gate electrode of the sixth transistor T6 is connected to a third reset control signal terminal to receive the third reset control signal RST3, a first electrode of the sixth transistor T6 is connected a holding voltage terminal to receive the holding voltage Vhold, and a second electrode of the sixth transistor T6 is connected to the third node N3 (the first terminal 110 of the driving circuit 100).

For example, in the threshold voltage compensation stage t2, as shown in FIG. 5C, the driving method provided by the present embodiment is different from the driving method shown in FIG. 4C in that the third reset control signal RST3 can be at a high voltage so that the sixth transistor T6 is turned on, while the first light emission control signal EM1 can be at a low voltage so that the fifth transistor T5 is turned off. Thus, in the Vth compensation stage, the second node N2 can be charged through the holding voltage, for example, Vhold, until the voltage at the second node N2 rises to the difference value between the first initialization voltage Vinit1 and the threshold voltage Vth of the first transistor T1. At the same time, the voltage at the third node N3 may be the holding voltage, for example, Vhold, which can be higher than VDD. At this time, the voltage difference Vgd between the gate electrode and the drain electrode of the first transistor T1 is equal to the difference value between Vinit1 and Vhold and is smaller than Vth (for example, it can be smaller than 0V), so the first transistor T1 is either in a turn-off state or in a saturated state, which is beneficial to stabilizing the characteristics of the first transistor T1.

For example, as shown in FIG. 5D, the third reset control signal RST3 may share the same timing sequence with the first reset control signal RST1, so as to avoid the problem that the voltage at the third node N3 has a drift in the initialization stage. The driving method shown in FIG. 5D is exactly the same as that shown in FIG. 5C, and the details will not be described here.

For example, according to the driving method shown in FIG. 5C, the second reset control signal RST2 and the third reset control signal RST3 can be subordinate to each other, that is, the second reset control signal RST2 and the third reset control signal RST3 are sent from the same signal source, and belong to signals corresponding to two time moments subordinate to each other so that the second reset control signal RST2 and the third reset control signal RST3 can share the one and same GOA, which is beneficial to simplifying the wiring layout of the display screen, improving the resolution and achieving a narrow bezel, etc.

At the same time, because the driving method shown in FIG. 5D and the driving method shown in FIG. 5C include the same stages t1, t3, t4 and t5 as those of the above-mentioned driving method shown in FIG. 4C, the details will not be repeated here.

Figure 7C:
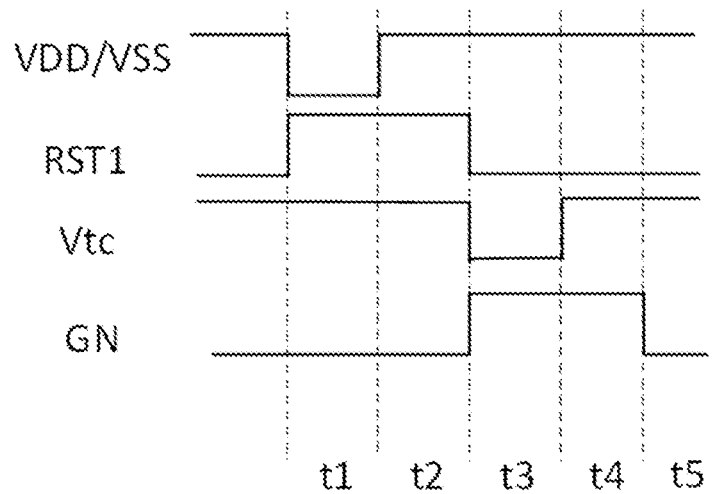
FIG. 7C is a signal timing diagram of a driving method of the pixel circuit shown in FIG. 7B.

At least some embodiments of the present disclosure further provide a driving method of a pixel circuit. FIG. 7C is a signal timing diagram of a driving method of a pixel circuit provided by at least some embodiments of the present disclosure. In conjunction with the signal timing diagram shown in FIG. 7C, the working principle of the pixel circuit shown in FIG. 7A will be explained below with reference to the case where the pixel circuit shown in FIG. 7A is particularly implemented as the pixel circuit structure shown in FIG. 7B by way of example.

For example, as shown in FIG. 7C, the driving method provided by the present embodiment may include five stages, namely, an initialization stage t1, a threshold voltage compensation stage t2, a data writing stage t3, a mobility compensation stage t4, and a light emission stage t5, and the time sequence waveforms of various signals in each stage are shown in FIG. 7C.

In the initialization stage t1, the first reset control signal RST1 is input, the first reset circuit 410 is switched on (i.e., turned on), the voltage transmission control signal is input, the voltage transmission control circuit 800 is turned on, and the second power supply voltage is input through the first power supply voltage terminal, so that the second terminal 120 of the driving circuit 100 is reset. For example, in the initialization stage t1, the voltage transmission control signal Vtc is at a high voltage, so that the eighth transistor T8 is turned on; and at the same time, the second power supply voltage, for example, VSS, is transmitted to the third node N3 (the first electrode of the first transistor T1). The first reset control signal RST1 is at a high voltage, so that the third transistor T3 is turned on, and the voltage at the first node N1 can be initialized to the first initialization voltage Vinit1, for example, a high voltage, for example, higher than VDD. The second transistor T2 is turned off by the low voltage of the gate scanning signal GN, which prevents from the input of the data signal Vdata. At this time, the voltage at the first node N1 is the first initialization voltage Vinit1, which can be a high voltage, for example, higher than VDD. The voltage at the third node N3 is a low voltage, which may be the second power supply voltage VSS, for example. For example, the voltage difference Vgs between the gate electrode and the source electrode of the first transistor T1 is equal to the difference value between the first initialization voltage Vinit1 and the second power supply voltage VSS and is greater than the threshold voltage Vth of the first transistor T1, so that the first transistor T1 is in a turn-on state and the voltage at the second node N2 drops to a low voltage such as the second power supply voltage VSS; in this way, the voltage at the second node N2 (the second terminal 120 of the driving circuit 100) is reset.

In the threshold voltage compensation stage t2, the first reset control signal RST1 is input, the first reset circuit 410 is switched on (i.e., turned on), the voltage transmission control signal is input, the voltage transmission control circuit 800 is turned on, and the first power supply voltage is input through the first power supply voltage terminal, so that a threshold compensation is performed on the driving circuit 100. For example, in the threshold voltage compensation stage t2, the voltage transmission control signal Vtc is at a high voltage, so that the eighth transistor T8 is turned on; and at the same time, the first power supply voltage, for example, VDD, is transmitted to the third node N3 (the first electrode of the first transistor T1). The first reset control signal RST1 is at a high voltage, so that the third transistor T3 is turned on, and the voltage at the first node N1 can be initialized to the first initialization voltage Vinit1, for example, a high voltage, for example, higher than VDD. The second transistor T2 is turned off by the low voltage of the gate scanning signal GN, which prevents from the input of the data signal Vdata. At this time, the voltage at the first node N1 is the first initialization voltage Vinit1, which can be a high voltage, for example, higher than VDD. The voltage at the third node N3 is a high voltage, for example, the first power supply voltage VDD. The voltage at the second node N2 gradually rises from the initial VSS, until the voltage difference Vgs between the gate electrode and the source electrode of the first transistor T1 is equal to the threshold voltage Vth of the first transistor T1; at this time, the voltage at the second node N2 is the difference value between the first initialization voltage Vinit1 and the threshold voltage Vth of the first transistor T1, so that the threshold voltage Vth of the first transistor T1 is written to both terminals of the first capacitor C1. Because the light-emitting device EL connected to the second node N2 can be considered as a capacitor with capacitance value much greater than that of the first capacitor C1, the voltage at the second node N2 is almost unchanged and remains as the difference value between the first initialization voltage Vinit1 and the threshold voltage Vth of the first transistor T1 in the previous stage t2; in this way, the threshold voltage Vth of the first transistor T1 is compensated, and the threshold voltage compensation is completed.

In the data writing stage t3, the gate scanning signal GN is input, the data writing circuit 200 is turned on, the data signal Vdata is written into the control terminal 130 of the driving circuit 100 through the data writing circuit 200, and the data signal Vdata as written in is stored through the storage circuit 300. For example, in the data writing stage t3, the voltage transmission control signal Vtc is at a low voltage, so that the eighth transistor T8 is turned off. The first reset control signal RST1 is at a low voltage, so that the third transistor T3 is turned off. The gate scanning signal GN is at a high voltage, so that the second transistor T2 is turned on. At this time, the voltage at the first node N1 is changed from the first initialization voltage Vinit1 to a higher voltage, for example, Vdata, that is, the data voltage Vdata (the voltage of the data signal Vdata), so that the first transistor T1 is turned on. At the same time, because the voltage at the first node N1 becomes the data voltage Vdata, the data voltage Vdata can be stored through the storage capacitor C1, and hence the data writing is completed.

In the mobility compensation stage t4, the input of the first reset control signal RST1 is stopped, the first reset circuit 410 is turned off, the gate scanning signal GN is input, the data writing circuit 200 is turned on, the voltage transmission control signal is input, the voltage transmission control circuit 800 is turned on, and the first power supply voltage is input through the first power supply voltage terminal, so that mobility compensation can be performed through the turn-on voltage transmission control circuit 800 and the turned-on data writing circuit 200. For example, in the mobility compensation stage t4, the voltage transmission control signal Vtc is at a high voltage, so that the eighth transistor T8 is turned on; and at the same time, the first power supply voltage, for example, VDD, is transmitted to the third node N3 (the first electrode of the first transistor T1). The first reset control signal RST1 is at a low voltage, so that the third transistor T3 is turned off. The gate scanning signal GN remains at a high voltage, so that the second transistor T2 remains turned-on. At this time, the first transistor T1 is turned on, and the driving current Ids flows from the first power supply voltage terminal, such as the VDD terminal, to the second node N2, and the voltage at the second node N2 gradually rises by $\Delta V$. At this time, the voltage VN2 of N2 is the sum of the gradually risen voltage ΔV plus the difference value between the first initialization voltage Vinit1 and the threshold voltage Vth of the first transistor T1, as described in the following formula: VN2=Vinit1−Vth+ΔV, wherein VN2 is the voltage at the second node N2, Vinit1 is the first initialization voltage, Vth is the threshold voltage of the first transistor T1, and ΔV is the gradually risen value of the voltage at the second node N2. The voltage at the first node N1 is still the data voltage Vdata due to the turn-on state of the second transistor T2. The driving current of the first transistor T1 is described as the following formula: Ids=kμ(Vgs−Vth)$^2$, wherein Ids is the driving current of the first transistor T1, k is a constant coefficient, μ is the mobility of the first transistor T1, Vgs is the voltage difference between the gate electrode and the source electrode of the first transistor T1, and Vth is the threshold voltage of the first transistor T1. As can be seen from the above formula, the greater the mobility 11 of the first transistor T1, the greater the driving current of the first transistor T1 and also the greater the gradually risen voltage ΔV of the second node N2, and correspondingly, the smaller the voltage difference between the gate electrode and the source electrode of the first transistor T1 and also the smaller the value of (Vgs−vth)$^2$; as a result, the driving current Ids of the first transistor T1 is corrected. For example, the driving current of driving transistors with different mobility values has little difference under the same data voltage Vdata.

In the light emission stage t5, the input of the first reset control signal RST1 is stopped, the first reset circuit 410 is turned off, the input of the gate scanning signal GN is stopped, the data writing circuit 200 is turned off, the voltage transmission control signal is input, and the voltage transmission control circuit 800 is turned on, so that the first power supply voltage can drive the light-emitting element to emit light through the turn-on voltage transmission control circuit 800 and the turned-on driving circuit 100. For example, in the light emission stage t5, the voltage transmission control signal Vtc is at a high voltage, so that the eighth transistor T8 is turned on; and at the same time, the first power supply voltage, for example, VDD, is transmitted to the third node N3 (the first electrode of the first transistor T1). The first reset control signal RST1 is at a low voltage, so that the third transistor T3 is turned off. The gate scanning signal GN is at a low voltage, so that the second transistor T2 is turned off. At this time, the voltage at the second node N2 rises to exceed the turn-on voltage of the light-emitting device EL, and the light-emitting device EL starts to emit light; because it is driven by a constant current, the voltage at the second node N2 will finally reach the turn-on voltage of the light-emitting device; at the same time, because the first node N1 is connected to the second node N2 through the first capacitor C1, the voltage at the first node N1 also rises to a stable state along with the voltage at the second node N2; even if the voltages at the two nodes N1 and N2 are changed, the voltage difference between the two nodes N1 and N2, that is, the voltage difference Vgs between the gate electrode and the source electrode of the first transistor T1, can remain unchanged, so the luminous current I is constant, as described in the following formula: I=kμ(Vdata−ΔV)$^2$, wherein I is the luminous current, k is a constant coefficient, μ is the mobility of the first transistor T1, Vdata is the data signal voltage, and ΔV is the gradually risen value of the voltage at the second node N2. Therefore, the pixel circuit achieves the technical effects of threshold voltage compensation, mobility (II) compensation and voltage drop (IR Drop) compensation at the same time.

Figure 8C:
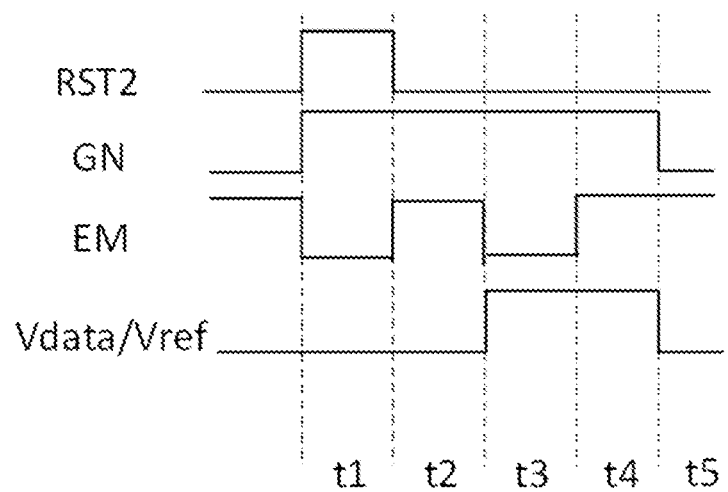
FIG. 8C is a signal timing diagram of a driving method of the pixel circuit shown in FIG. 8B.

At least some embodiments of the present disclosure further provide a driving method of a pixel circuit. FIG. 8C is a signal timing diagram of a driving method of a pixel circuit provided by at least some embodiments of the present disclosure. In conjunction with the signal timing diagram shown in FIG. 8C, the working principle of the pixel circuit shown in FIG. 8A will be explained below with reference to the case where the pixel circuit shown in FIG. 8A is particularly implemented as the pixel circuit structure shown in FIG. 8B by way of example.

For example, as shown in FIG. 8C, the driving method provided by the present embodiment may include five stages, namely, an initialization stage t1, a threshold voltage compensation stage t2, a data writing stage t3, a mobility compensation stage t4, and a light emission stage t5, and the time sequence waveforms of various signals in each stage are shown in FIG. 8C.

In the initialization stage t1, the second reset control signal RST2 is input, the second reset circuit 420 is switched on (i.e., turned on), the gate scanning signal GN is input, the data writing circuit 200 is turned on, and the reference voltage Vref is input to the control terminal 130 of the driving circuit 100 through the data writing circuit 200, so that the control terminal 130 of the driving circuit 100 is reset. For example, in the initialization stage t1, the first light emission control signal EM1 may be at a low voltage, so that the fifth transistor T5 is turned off. The second reset control signal RST2 is at a high voltage, so that the fourth transistor T4 is turned on, and that the second node N2 is initialized and the voltage at the second node N2 is the second initialization voltage Vinit2, for example, a low voltage, which allows the first transistor T1 to be turned on. At the same time, the voltage of the first electrode of the light-emitting device EL, such as the anode, is also the second initialization voltage Vinit2, so that the light-emitting device EL is reset and does not emit light. The gate scanning signal GN may be at a high voltage, so that the second transistor T2 is turned on. At the same time, the data signal terminal transmits the reference voltage Vref, for example, the first initialization voltage Vinit1, to the first electrode of the transistor T2; at this time, because the second transistor T2 is in a turn-on state, the voltage Vinit1 at the first node N1 is a high voltage, for example, higher than VDD, the voltage Vinit2 at the second node N2 is a low voltage, for example, lower than VSS, and the third node N3 remains at the first power supply voltage, for example, VDD. The voltage difference Vgs between the gate electrode and the source electrode of the first transistor T1 is equal to the difference value between the voltage Vinit2 at the second node N2 and the voltage Vinit1 at the first node N1, and is higher than the threshold voltage Vth of the first transistor T1, so that the first transistor T1 is turned on; while the voltage difference Vgd between the gate electrode and the drain electrode of the first transistor T1 is equal to the difference value between Vinit1 and VDD and is smaller than Vth, so that the first transistor T1 is either in a turn-off state or in a saturated state, which is beneficial to stabilizing the characteristics of the first transistor T1.

In the threshold voltage compensation stage t2, the input of the second reset control signal is stopped, the second reset circuit 420 is turned off, the gate scanning signal GN is input, the data writing circuit 200 is turned on, the reference voltage Vref is input to the control terminal 130 of the driving circuit 100 through the data writing circuit 200, the first light emission control signal is input, and the first light emission control circuit 500 is turned on, so that the threshold compensation of the driving circuit 100 can be performed through the turned-on driving circuit 100 and the storage circuit 300. For example, in the threshold voltage compensation stage t2, the first light emission control signal EM1 may be at a high voltage, so that the fifth transistor T5 is turned on. The second reset control signal RST2 is at a low voltage, so that the fourth transistor T4 is turned off. The gate scanning signal GN may be at a high voltage, so that the second transistor T2 is turned on. At the same time, the data signal terminal transmits the reference voltage Vref, for example, the first initialization voltage Vinit1, to the first electrode of the transistor T2; because the second transistor T2 is in a turn-on state, the voltage at the first node N1 connected to the second electrode of the second transistor T2 is also the first initialization voltage Vinit1, which can be a high voltage, for example. At this time, the voltage at the first node N1, i.e., the first initialization voltage Vinit1, is a high voltage, for example, higher than VDD, the voltage at the third node N3 is a high voltage, for example, VDD, and the voltage at the second node N2 gradually rises from the initial, second initialization voltage Vinit2, until the voltage difference Vgs between the gate electrode and the source electrode of the first transistor T1 is equal to the threshold voltage Vth of the first transistor T1; at this time, the voltage at the second node N2 is the difference value between the first initialization voltage Vinit1 and the threshold voltage Vth of the first transistor T1, so that the threshold voltage Vth of the first transistor T1 is written to both terminals of the first capacitor C1. Because the light-emitting device EL connected to the second node N2 can be considered as a capacitor with capacitance value much greater than that of the first capacitor C1, the voltage at the point of the second node N2 is almost unchanged and remains as the difference value between the first initialization voltage Vinit1 and the threshold voltage Vth of the first transistor T1 in the previous stage t2; in this way, the threshold voltage Vth of the first transistor T1 is compensated, and the threshold voltage compensation is completed.

In the data writing stage t3, the gate scanning signal GN is input, the data writing circuit 200 is turned on, the data signal Vdata is written into the control terminal 130 of the driving circuit 100 through the data writing circuit 200, and the data signal Vdata as written in is stored through the storage circuit 300. For example, in the data writing stage t3, the first light emission control signal EM1 may be at a low voltage, so that the fifth transistor T5 is turned off. The second reset control signal RST2 is at a low voltage, so that the fourth transistor T4 is turned off. The gate scanning signal GN may be at a high voltage, so that the second transistor T2 is turned on. At the same time, the data signal terminal transmits the data voltage Vdata to the first electrode of the transistor T2; at this time, because the second transistor T2 is in a turn-on state, the voltage at the first node N1 is changed from the first initialization voltage Vinit1 to a higher voltage, for example, Vdata, that is, the data voltage Vdata (the voltage of the data signal Vdata), so that the first transistor T1 is turned on. At the same time, because the voltage at the first node N1 becomes the data voltage Vdata, the data voltage Vdata can be stored through the storage capacitor C1, and the data writing is completed.

In the mobility compensation stage t4, the input of the second reset control signal is stopped, the second reset circuit 420 is turned off, the gate scanning signal GN is input, the data writing circuit 200 is turned on and the data voltage Vdata is input, the first light emission control signal is input and the first light emission control circuit 500 is turned on, so that the mobility compensation can be performed through the turned-on first light emission control circuit 500 and the turned-on data writing circuit 200. For example, in the mobility compensation stage t4, the first light emission control signal EM1 may be at a high voltage, so that the fifth transistor T5 is turned on. The second reset control signal RST2 is at a low voltage, so that the fourth transistor T4 is turned off. The gate scanning signal GN may be at a high voltage, so that the second transistor T2 is turned on. At the same time, the data signal terminal transmits the data voltage Vdata to the first electrode of the transistor T2; at this time because the second transistor T2 is in a turn-on state, the voltage at the first node N1 remains at a higher voltage, for example, Vdata. At this time, the first transistor T1 is turned on, the driving current Ids flows from the first power supply voltage terminal, such as the VDD terminal, to the second node N2, and the voltage at the second node N2 gradually rises by $\Delta V$; at this time, the voltage VN2 at N2 is the sum of the gradually risen voltage $\Delta V$ plus the difference value between the first initialization voltage Vinit1 and the threshold voltage Vth of the first transistor T1, as described in the following formula: $VN2=Vinit1-Vth+\Delta V$, wherein VN2 is the voltage at the second node N2, Vinit1 is the first initialization voltage, Vth is the threshold voltage of the first transistor T1, and $\Delta V$ is the gradually risen value of the voltage at the second node N2. The voltage at the first node N1 still is the data voltage Vdata due to the turn-on state of the second transistor T2. The driving current of the first transistor T1 is described as the following formula: $Ids=k\mu(Vgs-Vth)^2$, wherein Ids is the driving current of the first transistor T1, k is a constant coefficient, $\mu$ is the mobility of the first transistor T1, Vgs is the voltage difference between the gate electrode and the source electrode of the first transistor T1, and Vth is the threshold voltage of the first transistor T1. As can be seen from the above formula, the greater the mobility $\mu$ of the first transistor T1, the greater the driving current of the first transistor T1 and also the greater the gradually risen voltage $\Delta V$ of the second node N2, and correspondingly, the smaller the voltage difference between the gate electrode and the source electrode of the first transistor T1 and also the smaller the value of $(Vgs-vth)^2$; as a result, the driving current Ids of the first transistor T1 is corrected. For example, the driving current of driving transistors with different mobility values has little difference under the same data voltage Vdata.

In the light emission stage t5, the input of the second reset control signal is stopped, the second reset circuit 420 is turned off, the input of the gate scanning signal GN is stopped, the data writing circuit 200 is turned off, the first light emission control signal is input and the first light emission control circuit 500 is turned on, so that the first power supply voltage can drive the light-emitting element to emit light through the turned-on first light emission control circuit 500 and the turned-on driving circuit 100. For example, in the light emission stage T5, the first light emission control signal EM1 may be at a high voltage, so that the fifth transistor t5 is turned on. The second reset control signal RST2 is at a low voltage, so that the fourth transistor T4 is turned off. The gate scanning signal GN is at a low voltage, so that the second transistor T2 is turned off. At this time, the voltage at the second node N2 rises to exceed the turn-on voltage of the light-emitting device EL, and the light-emitting device EL starts to emit light; because it is driven by a constant current, the voltage at the second node N2 will finally reach the turn-on voltage of the light-emitting device; at the same time, because the first node N1 is connected to the second node N2 through the first capacitor C1, the voltage at the first node N1 also rises to a stable state along with the voltage at the second node N2; even if the voltages at the two nodes N1 and N2 are changed, the voltage difference between the two nodes N1 and N2, that is, the voltage difference Vgs between the gate electrode and the source electrode of the first transistor T1, can remain unchanged, so the luminous current I is constant, as described in the following formula: $I=k\mu(Vdata-\Delta V)^2$, wherein I is the luminous current, k is a constant coefficient, μ is the mobility of the first transistor T1, Vdata is the data signal voltage, and ΔV is the gradually risen value of the voltage at the second node N2. Therefore, the pixel circuit achieves the technical effects of threshold voltage compensation, mobility (μ) compensation and voltage drop (IR Drop) compensation at the same time.

The technical effects of the driving method of the pixel circuit provided by the embodiments of the present disclosure refer to the corresponding descriptions of the pixel circuit 10 in the above-mentioned embodiment, and the details are not repeated here.

At least some embodiments of the present disclosure further provide a display panel including a plurality of pixel units arranged in an array, for example, each of the plurality of pixel units includes the pixel circuit provided by any of the embodiments of the present disclosure.

Figure 9A:
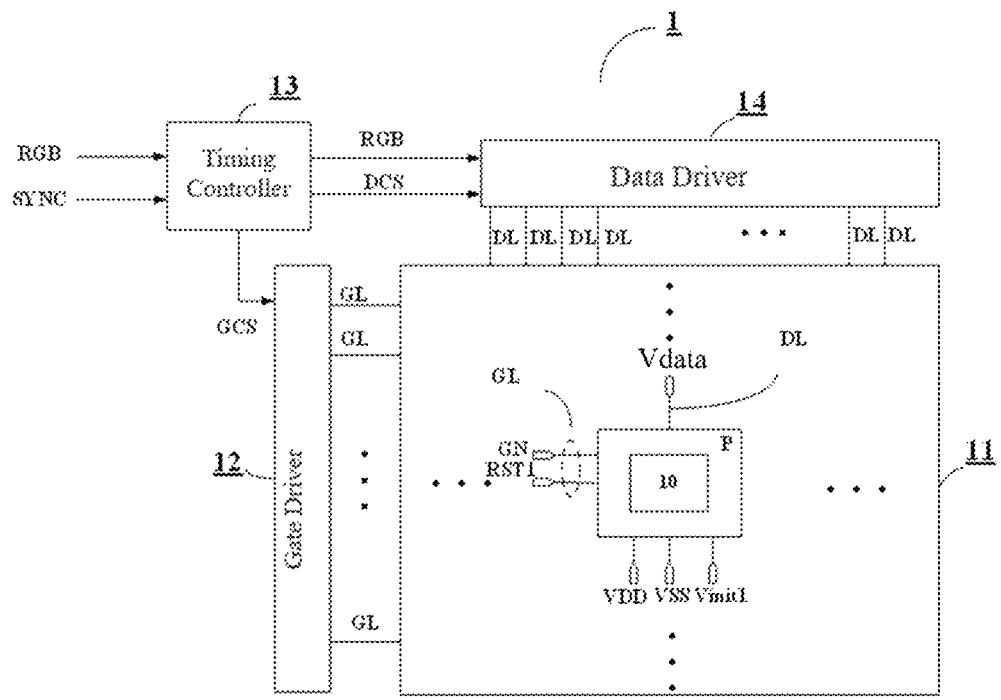
FIGS. 9A to 9F are schematic diagrams of a display panel provided by an embodiment of the present disclosure.

FIG. 9A is a schematic block diagram of a display panel provided by some embodiments of the present disclosure. As shown in FIG. 9A, the display panel 11 is provided in a display device 1 and is electrically connected to a gate driver 12, a timing controller 13 and a data driver 14. The display panel 11 includes pixel units P defined by a plurality of gate lines GL intersecting with a plurality of data lines DL; the gate driver 12 is used for driving the plurality of gate lines GL; the data driver 14 is used for driving the plurality of data lines DL; the timing controller 13 is used for processing image data RGB input from the outside of the display device 1, supplying the data driver 14 with processed image data RGB, and outputting a scanning control signal GCS and a data control signal DCS to the gate driver 12 and the data driver 14 so as to control the gate driver 12 and the data driver 14.

For example, the display panel 11 includes a plurality of pixel units P including any pixel circuit 10 provided in the above embodiments. For example, the pixel circuit 10 shown in FIG. 2B is included. As shown in FIG. 9A, the display panel 11 further includes a plurality of scanning lines GL and a plurality of data lines DL. For example, the plurality of scanning lines are correspondingly connected to the data writing circuits 200 in the pixel circuits 10 of each row of pixel units to provide the gate scanning signal, and are also correspondingly connected to the first reset circuits 410 in the pixel circuits 10 of each row of pixel units to provide the first reset control signal.

For example, the pixel unit P is disposed in an intersection area of the scanning line GL and the data line DL. For example, as shown in FIG. 9A, each pixel unit P is connected to two scanning lines GL (for providing the gate scanning signal and the first reset control signal, respectively), one data line DL, a first power supply voltage line for providing the first power supply voltage, a second power supply voltage line for providing the second power supply voltage, and a first initialization voltage line for providing the first initialization voltage. For example, the first voltage line or the second voltage line may be replaced by a corresponding plate-shaped common electrode (such as a common anode or a common cathode). It should be noted that in FIG. 9A, only part of the pixel unit P, the scanning line GL and the data line DL are shown.

For example, the plurality of pixel units P are arranged in a plurality of rows, the first reset circuits 410 of the pixel circuits in each row of pixel units P are connected to one scanning line GL to receive the first reset control signal, and the data writing circuits 200 of the pixel circuits in each row of pixel units P are connected to another scanning line GL to receive the gate scanning signal. For example, the data line DL of each column is connected to the data writing circuit 200 of the pixel circuit 10 in this column to provide the data signal.

Figure 9B:
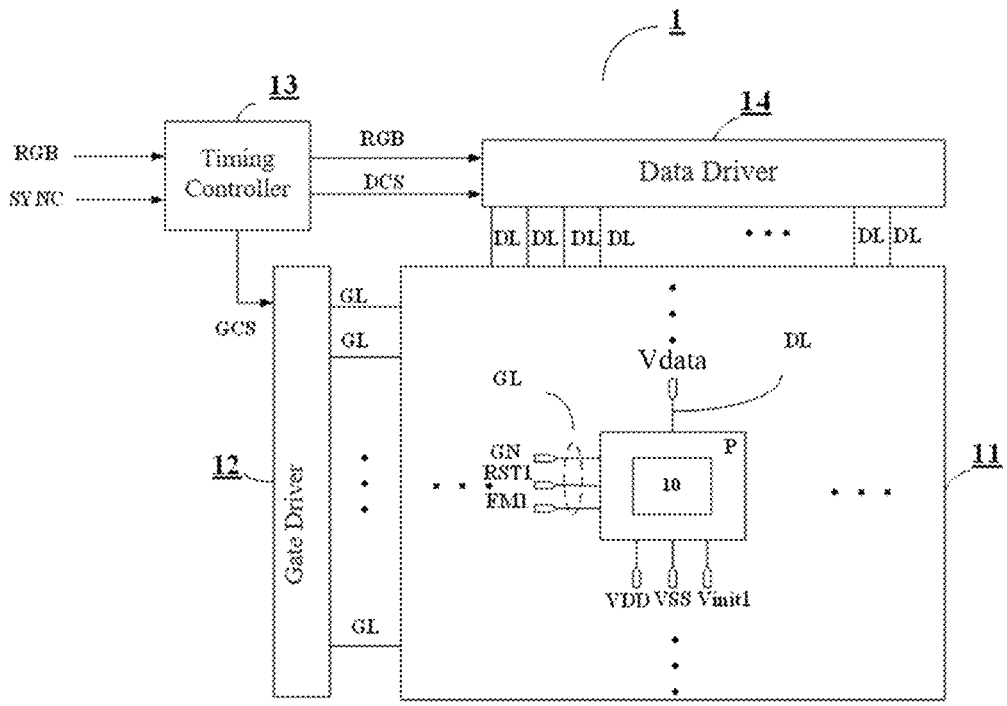

FIG. 9B is a schematic block diagram of a display panel provided by some embodiments of the present disclosure. The connection relationship between the display panel 11 and the display device shown in FIG. 9B is the same as that of the panel shown in FIG. 9A, and the details are not repeated here.

For example, the display panel 11 includes a plurality of pixel units P including any pixel circuit 10 provided in the above embodiments. For example, the pixel circuit 10 shown in FIG. 7B is included. As shown in FIG. 9B, the display panel 11 further includes a plurality of scanning lines GL and a plurality of data lines DL. For example, the plurality of scanning lines are also correspondingly connected to the voltage transmission circuits 800 in the pixel circuits 10 of each row of pixel units to provide the voltage transmission control signal.

For example, the pixel unit P is disposed in an intersection area of the scanning line GL and the data line DL. For example, as shown in FIG. 9B, each pixel unit P is further connected to one scanning line GL (for providing the first light emission control signal) as compared with each pixel unit shown in FIG. 9A. It should be noted that in FIG. 9B, only part of the pixel units P, the scanning lines GL and the data lines DL are shown.

For example, the plurality of pixel units P are arranged in a plurality of rows, and the first light emission control circuits 500 of the pixel circuits in each row of pixel units P are connected to one scanning line GL to receive the first light emission control signal.

For example, as shown in FIG. 9B, the display panel includes a first power supply voltage line that can provide the second power supply voltage. Meanwhile, according to another pixel circuit 10 provided by some embodiments of the present disclosure, the pixel circuit can be connected to the first power supply voltage line that provides the second power supply voltage through the first power supply voltage terminal, so that the second power supply voltage can be received from the first power supply voltage terminal.

For example, as shown in FIG. 9B, the display panel 11 includes a plurality of pixel units P including any pixel circuit 10 provided in the above embodiments. For example, the pixel circuit 10 shown in FIG. 8B is included. The display panel includes a scanning line GL that can provide the second reset control signal. Meanwhile, according to another pixel circuit 10 provided by some embodiments of the present disclosure, the pixel circuit can be connected to the scanning line GL that provides the second reset control signal through the first reset control signal terminal, so that the second reset control signal can be received from the first reset control signal terminal. At the same time, the display panel includes a data line DL that can provide the first initialization voltage, and the pixel circuit can be connected to the data line DL that provides the first initialization voltage through the data signal terminal, so that the first reset control signal can be received from the data signal terminal.

Figure 9C:
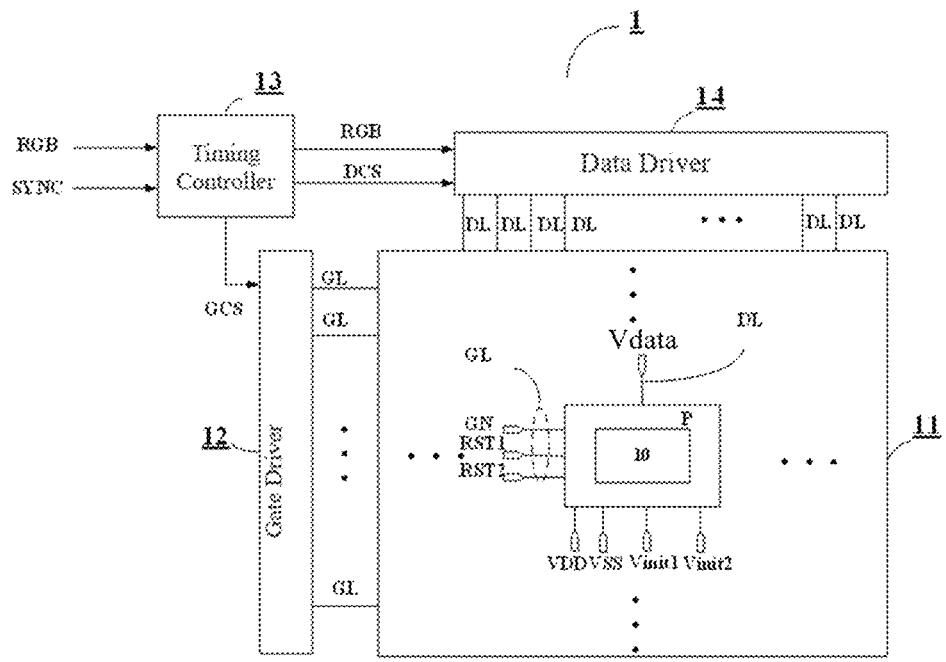

FIG. 9C is a schematic block diagram of a display panel provided by some embodiments of the present disclosure.

The connection relationship between the display panel 11 and the display device shown in FIG. 9C is the same as that of the panel shown in FIG. 9A, and the details are not repeated here.

For example, the display panel 11 shown in FIG. 9C includes a plurality of pixel units P including any pixel circuit 10 provided in the above embodiments. For example, the pixel circuit 10 shown in FIG. 3B is included. As shown in FIG. 9C, the display panel 11 further includes a plurality of scanning lines GL and a plurality of data lines DL. For example, the plurality of scanning lines are also correspondingly connected to the second reset circuits 420 in the pixel circuits 10 of each row of pixel units to provide the second reset control signal.

For example, the pixel unit P is disposed in an intersection area of the scanning line GL and the data line DL. For example, as shown in FIG. 9C, each pixel unit P is further connected to one scanning line GL (for providing the second reset control signal) and a second initialization voltage line for providing the second initialization voltage, as compared with each pixel unit shown in FIG. 9A. It should be noted that in FIG. 9C, only part of the pixel unit P, the scanning line GL and the data line DL are shown.

For example, the plurality of pixel units P are arranged in a plurality of rows, the second reset circuits 420 in the pixel circuits of each row of pixel units P are connected to one scanning line GL to receive the second reset control signal, and the second initialization voltage terminals in the pixel circuits of each row of pixel units P are connected to a second initialization voltage line to receive the second initialization voltage.

Figure 9D:
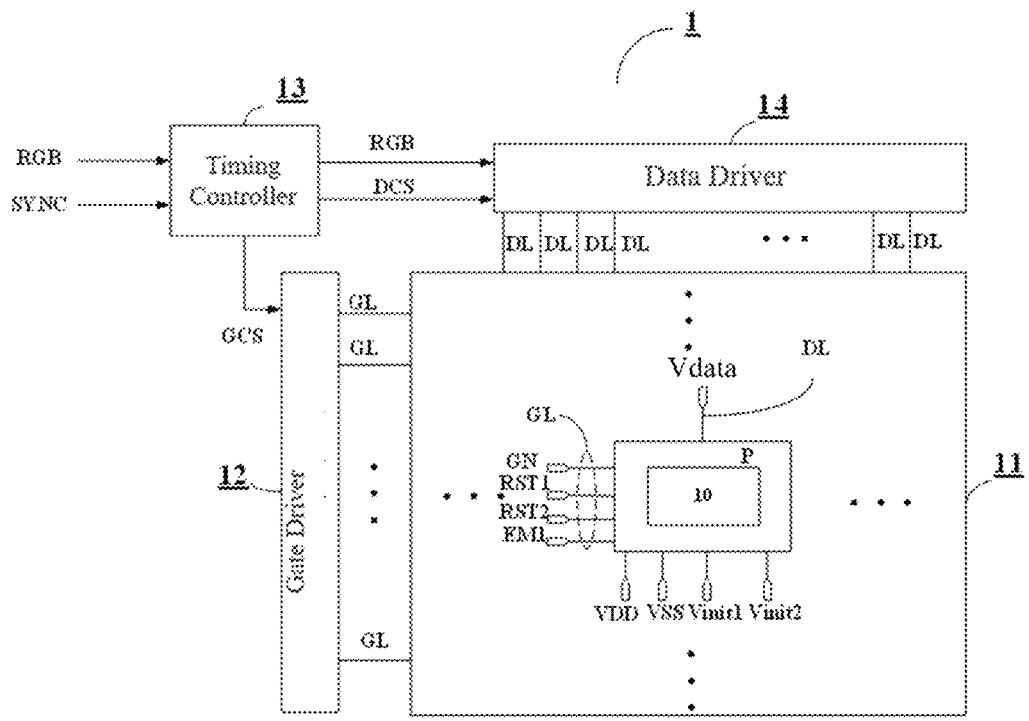

FIG. 9D is a schematic block diagram of a display panel provided by some embodiments of the present disclosure. The connection relationship between the display panel 11 and the display device as shown in FIG. 9D is the same as that of the panel shown in FIG. 9C, and the details will not be repeated here.

For example, the display panel 11 shown in FIG. 9D includes a plurality of pixel units P including any pixel circuit 10 provided in the above embodiments. For example, the pixel circuit 10 shown in FIG. 4B is included. As shown in FIG. 9B, the display panel 11 further includes a plurality of scanning lines GL and a plurality of data lines DL. For example, the plurality of scanning lines are also correspondingly connected to the first light emission control circuits 500 in the pixel circuits 10 of each row of pixel units to provide the first light emission control signal.

For example, the pixel unit P is disposed in an intersection area of the scanning line GL and the data line DL. For example, as shown in FIG. 9D, each pixel unit P is further connected to one scanning line GL (for providing the first light emission control signal) as compared with each pixel unit shown in FIG. 9C. It should be noted that in FIG. 9D, only part of the pixel units P, the scanning lines GL and the data lines DL are shown.

For example, the plurality of pixel units P are arranged in a plurality of rows, and the first light emission control circuits 500 in the pixel circuits of each row of pixel units P are connected to one scanning line GL to receive the first light emission control signal.

For example, as shown in FIG. 9D, the display panel 11 includes a plurality of pixel units P including any pixel circuit 10 provided in the above embodiments. For example, the pixel circuit 10 shown in FIG. 6B is included. The display panel includes a scanning line GL that can provide the second light emission control signal; and at the same time, the pixel circuit 10 can be connected to the scanning line GL that provides the second light emission control signal through the first light emission control signal terminal, so that the second light emission control signal can be received from the first light emission control signal terminal. At the same time, the second reset control signal and the gate scanning signal can share the one and same scanning line GL, which can simplify the layout space around the display panel, thereby realizing the development of a high-resolution display panel.

Figure 9E:
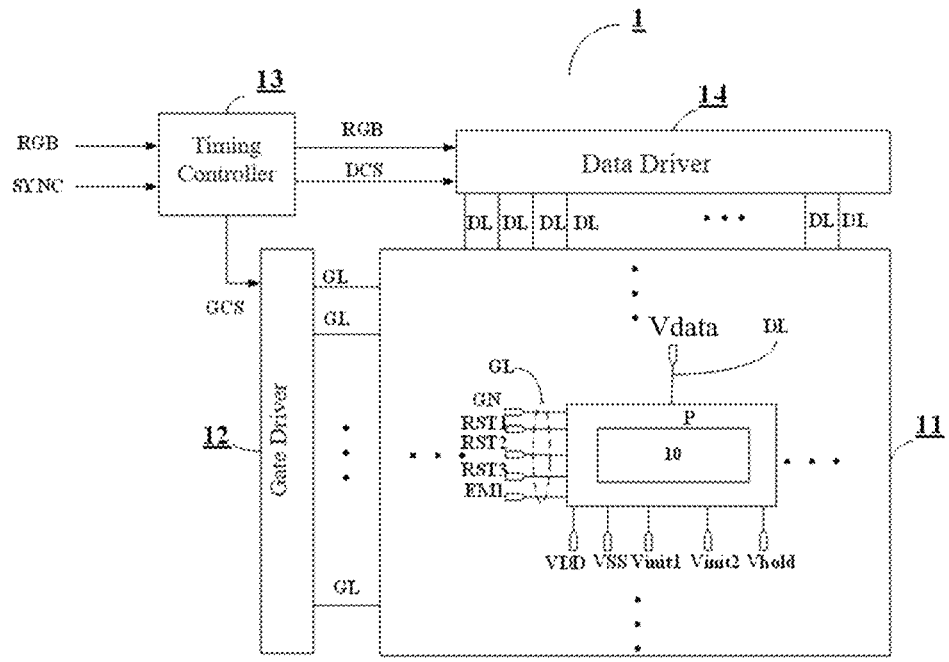

FIG. 9E is a schematic block diagram of a display panel provided by some embodiments of the present disclosure. The connection relationship between the display panel 11 and the display device shown in FIG. 9E is the same as that of the panel shown in FIG. 9D, and the details are not repeated here.

For example, the display panel 11 shown in FIG. 9E includes a plurality of pixel units P including any pixel circuit 10 provided in the above embodiments. For example, the pixel circuit 10 shown in FIG. 5B is included. As shown in FIG. 9E, the display panel 11 further includes a plurality of scanning lines GL and a plurality of data lines DL. For example, the plurality of scanning lines are also correspondingly connected to the third reset circuits 430 in the pixel circuits 10 of each row of pixel units to provide the third reset control signal.

For example, the pixel unit P is disposed in an intersection area of the scanning line GL and the data line DL. For example, as shown in FIG. 9E, each pixel unit P is further connected to one scanning line GL (for providing the third reset control signal) and a holding voltage line for providing the holding voltage, as compared with each pixel unit shown in FIG. 9D. It should be noted that in FIG. 9E, only part of the pixel units P, the scanning lines GL and the data lines DL are shown.

For example, the plurality of pixel units P are arranged in a plurality of rows, the third reset circuits 430 in the pixel circuits of each row of pixel units P are connected to one scanning line GL to receive the third reset control signal, and the holding voltage terminals of in the pixel circuits of each row of pixel units P are connected to the holding voltage line to receive the holding voltage.

Figure 9F:
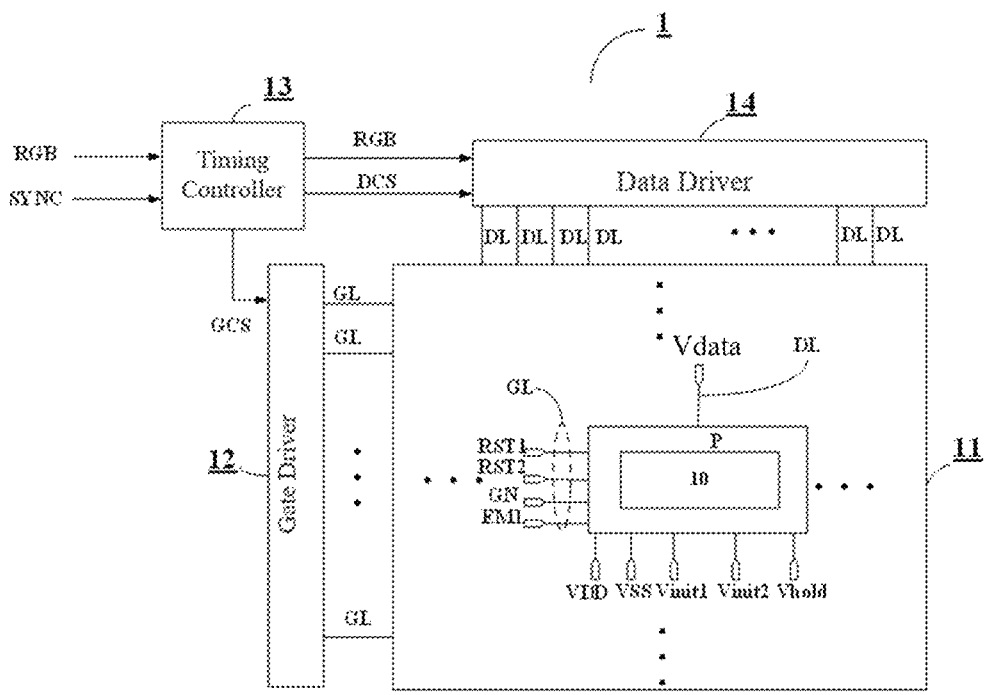

It should be noted that, as shown in the schematic block diagram of a display panel in FIG. 9F, by receiving the second reset control signal, the third reset circuit 430 of the pixel circuit of this pixel unit P can also achieve the same technical effects as those of the third reset circuit 430 which receives the third reset control signal; that is to say, the third reset control signal received by the third reset circuit 430 can be replaced by the second reset control signal. At the same time, the second reset control signal and the third reset control signal belong to signals corresponding to a previous time moment and a next time moment relative to each other, so that the second reset control signal and the third reset control signal can share one scanning line GL, which can simplify the layout space around the display panel and realize the development of a high-resolution display panel.

For example, the gate driver 12 supplies a plurality of gating signals to a plurality of scanning lines GL according to a plurality of scanning control signals GCS sent from the timing controller 13. The plurality of gating signals include the gate scanning signal, the first reset control signal, the second reset control signal, the third reset control signal, the first light emission control signal and the second light emission control signal. These signals are supplied to each pixel unit P through the plurality of scanning lines GL.

For example, the data driver 14 uses a reference gamma voltage to convert digital image data RGB input from the timing controller 13 into data signals, according to a plurality of data control signals DCS sent from the timing controller 13. The data driver 14 supplies the data signals as converted to the plurality of data lines DL.

For example, the timing controller 13 processes the image data RGB input from the outside to be matched with the size and the resolution of the display panel 11, and then provides the processed image data to the data driver 14. The timing controller 13 generates a plurality of scanning control signals GCS and a plurality of data control signals DCS by using synchronization signals (such as dot clock DCLK, data enabling signal DE, horizontal synchronization signal Hsync and vertical synchronization signal Vsync) input from the outside of the display device. The timing controller 13 provides the scanning control signals GCS and the data control signals DCS as generated to the gate driver 12 and the data driver 14, respectively, for the control of the gate driver 12 and the data driver 14.

For example, the data driver 14 can be connected to a plurality of data lines DL to provide the data signal Vdata; at the same time, the data driver 14 can also be connected to a plurality of first voltage lines, a plurality of second voltage lines and a plurality of initialization voltage lines to provide the first power supply voltage, the second power supply voltage and the initialization voltage, respectively.

For example, the gate driver 12 and the data driver 14 may be implemented as a semiconductor chip. For example, the display device 1 may also include other components, such as a signal decoding circuit, a voltage conversion circuit, etc. Known conventional components may be adopted as these components, for example, and will not be described in detail here.

For example, the display device in the present embodiment can be a monitor, a television, an electronic paper display device, a mobile phone, a tablet computer, a notebook computer, a digital photo frame, a navigator and other products or components with display functions. It should be noted that the display device can also include other conventional components or structures. For example, in order to realize the necessary functions of the display device, other conventional components or structures can be arranged by a person skilled in the art according to specific application scenarios, which are not limited in the embodiments of the present disclosure.

The technical effects of the display device provided by at least some embodiments of the present disclosure can refer to the corresponding descriptions of the pixel circuit 10 in the above-mentioned embodiments, and the details are not repeated here.

For this disclosure, the following points should be noted:
(1) Only the structures relevant to the embodiments of the present disclosure are involved in the accompanying drawings of the embodiments of the present invention, and other structures may refer to the normal designs.
(2) The embodiments of the present disclosure and the characteristics in the embodiments may be mutually combined without conflict.

The foregoing are only exemplary embodiments of the present disclosure and are not intended to limit the scope of protection of the present disclosure, and any variations or substitutions readily conceivable by any person skilled in the art within the scope of the technology disclosed herein shall be covered by the scope of protection of the present disclosure. Accordingly, the scope of protection of the present disclosure is determined by the appended claims.

The invention claimed is:

1. A pixel circuit, comprising a driving circuit, a data writing circuit, a storage circuit, and a first reset circuit, wherein
the driving circuit comprises a control terminal, a first terminal, and a second terminal, and is configured to control a driving current flowing through the first terminal and the second terminal for driving a light-emitting element to emit light;
the data writing circuit is configured to write a data signal to the control terminal of the driving circuit under a control of a first scanning signal;
the storage circuit is configured to store the data signal;
the first reset circuit is configured to apply a first initialization voltage to the control terminal of the driving circuit under a control of a first reset control signal;
the driving circuit and the data writing circuit each comprise an N-type thin film transistor, and the first reset circuit comprises an N-type oxide thin film transistor;
the pixel circuit further comprises a second reset circuit, the second reset circuit is configured to apply a second initialization voltage to the second terminal of the driving circuit under a control of a second reset control signal;
the first reset control signal is input to the first reset circuit during an initialization stage of the pixel circuit to turn on the first reset circuit, thereby resetting the control terminal of the driving circuit, the second reset control signal is input to the second reset circuit during the initialization stage of the pixel circuit to turn on the second reset circuit, thereby resetting the second terminal of the driving circuit; and
a duration for which the first reset control signal turns on the first reset circuit is greater than a duration for which the second reset control signal turns on the second reset circuit, a stage where the first reset circuit is turned on and the second reset circuit is turned off serves as a threshold voltage compensation stage for the pixel circuit in which threshold compensation is performed for the driving circuit and the storage circuit,
wherein the pixel circuit further comprises a first light emission control circuit and a third reset circuit, wherein,
the first light emission control circuit is configured to apply a first power supply voltage to the first terminal of the driving circuit under a control of a first light emission control signal,
the third reset circuit is configured to apply a holding voltage to the first terminal of the driving circuit under a control of a third reset control signal,
the third reset control signal and the first reset control signal both are turn-on signals in at least part of a time period,
wherein the third reset circuit comprises a sixth transistor which is an N-type thin film transistor,
a gate electrode of the sixth transistor is connected to a third reset control signal terminal to receive the third reset control signal, a first electrode of the sixth transistor is connected to a holding voltage terminal to receive the holding voltage, and a second electrode of the sixth transistor is connected to the first terminal of the driving circuit.

2. A pixel circuit, comprising a driving circuit, a data writing circuit, a storage circuit, and a first reset circuit, wherein
the driving circuit comprises a control terminal, a first terminal, and a second terminal, and is configured to control a driving current flowing through the first terminal and the second terminal for driving a light-emitting element to emit light;

the data writing circuit is configured to write a data signal to the control terminal of the driving circuit under a control of a first scanning signal;

the storage circuit is configured to store the data signal;

the first reset circuit is configured to apply a first initialization voltage to the control terminal of the driving circuit under a control of a first reset control signal;

the driving circuit and the data writing circuit each comprise an N-type thin film transistor, and the first reset circuit comprises an N-type oxide thin film transistor;

the pixel circuit further comprises a second reset circuit, the second reset circuit is configured to apply a second initialization voltage to the second terminal of the driving circuit under a control of a second reset control signal;

the first reset control signal is input to the first reset circuit during an initialization stage of the pixel circuit to turn on the first reset circuit, thereby resetting the control terminal of the driving circuit, the second reset control signal is input to the second reset circuit during the initialization stage of the pixel circuit to turn on the second reset circuit, thereby resetting the second terminal of the driving circuit; and a duration for which the first reset control signal turns on the first reset circuit is greater than a duration for which the second reset control signal turns on the second reset circuit, a stage where the first reset circuit is turned on and the second reset circuit is turned off serves as a threshold voltage compensation stage for the pixel circuit in which threshold compensation is performed for the driving circuit and the storage circuit, wherein the pixel circuit further comprises a voltage transmission circuit, wherein the voltage transmission circuit is configured to transmit a second power supply voltage to the first terminal of the driving circuit in a first time period, and to transmit a first power supply voltage different from the second power supply voltage to the first terminal of the driving circuit in a second time period, under a control of a voltage transmission control signal.

3. The pixel circuit according to claim 2, wherein the N-type thin film transistor comprised in the driving circuit is a first transistor, a gate electrode of the first transistor serves as the control terminal of the driving circuit, a first electrode of the first transistor serves as the first terminal of the driving circuit, and a second electrode of the first transistor serves as the second terminal of the driving circuit.

4. The pixel circuit according to claim 2, wherein the N-type thin film transistor comprised in the data writing circuit is a second transistor, a gate electrode of the second transistor is connected to a first scanning signal terminal to receive the first scanning signal, a first electrode of the second transistor is connected to a data signal terminal to receive the data signal, and a second electrode of the second transistor is connected to the control terminal of the driving circuit.

5. The pixel circuit according to claim 2, wherein the storage circuit comprises a storage capacitor, a first electrode of the storage capacitor is connected to the control terminal of the driving circuit, and a second electrode of the storage capacitor is connected to the second terminal of the driving circuit.

6. The pixel circuit according to claim 2, wherein the N-type oxide thin film transistor comprised in the first reset circuit is a third transistor, a gate electrode of the third transistor is connected to a first reset control signal terminal to receive the first reset control signal, a first electrode of the third transistor is connected to a first initialization voltage terminal to receive the first initialization voltage, and a second electrode of the third transistor is connected to the control terminal of the driving circuit.

7. The pixel circuit according to claim 2, wherein the second reset circuit comprises a fourth transistor which is an N-type thin film transistor, a gate electrode of the fourth transistor is connected to a second reset control signal terminal to receive the second reset control signal, a first electrode of the fourth transistor is connected to a second initialization voltage terminal to receive the second initialization voltage, and a second electrode of the fourth transistor is connected to the second terminal of the driving circuit.

8. The pixel circuit according to claim 2, further comprising a first light emission control circuit, wherein the first light emission control circuit is configured to apply a first power supply voltage to the first terminal of the driving circuit under a control of a first light emission control signal.

9. The pixel circuit according to claim 8, wherein the first light emission control circuit comprises a fifth transistor which is an N-type thin film transistor, a gate electrode of the fifth transistor is connected to a first light emission control terminal to receive the first light emission control signal, a first electrode of the fifth transistor is connected to a first power supply terminal to receive the first power supply voltage, and a second electrode of the fifth transistor is connected to the first terminal of the driving circuit.

10. The pixel circuit according to claim 8, further comprising a third reset circuit, wherein, the third reset circuit is configured to apply a holding voltage to the first terminal of the driving circuit under a control of a third reset control signal, the third reset control signal and the first reset control signal both are turn-on signals in at least part of a time period.

11. The pixel circuit according to claim 10, wherein the third reset control signal and the first reset control signal are the same control signal.

12. The pixel circuit according to claim 2, further comprising a second light emission control circuit, wherein the second light emission control circuit is configured to apply the driving current to a first electrode of the light-emitting element under a control of a second light emission control signal.

13. The pixel circuit according to claim 12, wherein the second light emission control circuit comprises a seventh transistor which is an N-type thin film transistor, a gate electrode of the seventh transistor is connected to a second light emission control terminal to receive the second light emission control signal, a first electrode of the seventh transistor is connected to the second terminal of the driving circuit, and a second electrode of the seventh transistor is connected to the first electrode of the light-emitting element.

14. The pixel circuit according to claim 2, wherein the voltage transmission circuit comprises an eighth transistor which is an N-type thin film transistor, a gate electrode of the eighth transistor is connected to a voltage transmission control signal terminal to receive the voltage transmission control signal, a first electrode of the eighth transistor is connected to a first power supply terminal, and a second electrode of the eighth transistor is connected to the first terminal of the driving circuit, the first power supply terminal is configured to provide the second power supply voltage in the first time period, and to provide the first power supply voltage in the second time period.

15. A display panel, comprising a plurality of pixel units arranged in an array, wherein each of the plurality of pixel units comprises the pixel circuit according to claim 2.

16. A driving method of the pixel circuit according to claim 2, comprising the initialization stage, the threshold voltage compensation stage, a data writing and mobility compensation stage, and a light emission stage, wherein
- in the initialization stage, inputting the first reset control signal and the second reset control signal, turning on the first reset circuit and the second reset circuit, applying the first initialization voltage to the control terminal of the driving circuit through the first reset circuit to reset the control terminal of the driving circuit, and applying the second initialization voltage to the second terminal of the driving circuit through the second reset circuit to reset the second terminal of the driving circuit;
- in the threshold voltage compensation stage, inputting the first reset control signal, turning on the first reset circuit, applying the first initialization voltage to the control terminal of the driving circuit through the first reset circuit to turn on the driving circuit, stopping an input of the second reset control signal, turning off the second reset circuit, and performing a threshold compensation through the turned-on driving circuit and the storage circuit;
- in the data writing stage, inputting a gate scanning signal, turning on the data writing circuit, writing the data signal into the control terminal of the driving circuit through the data writing circuit, and storing the data signal as written in through the storage circuit; and
- in the light emission stage, stopping an input of the gate scanning signal, and turning off the data writing circuit, so that the driving circuit generates the driving current under a control of the data signal stored in the storage circuit to drive the light-emitting element to emit light.

17. A pixel circuit, comprising a driving circuit, a data writing circuit, a storage circuit, and a first reset circuit, wherein
- the driving circuit comprises a control terminal, a first terminal and a second terminal, and is configured to control a driving current flowing through the first terminal and the second terminal for driving a light-emitting element to emit light;
- the data writing circuit is configured to write a data signal to the control terminal of the driving circuit under a control of a first scanning signal;
- the storage circuit is configured to store the data signal;
- the first reset circuit is configured to apply a first initialization voltage to the control terminal of the driving circuit under a control of a first reset control signal;
- the driving circuit and the data writing circuit each comprise an N-type thin film transistor, and the first reset circuit comprises an N-type oxide thin film transistor;
- the pixel circuit further comprises a second reset circuit, the second reset circuit is configured to apply a second initialization voltage to the second terminal of the driving circuit under a control of a second reset control signal;
- the pixel circuit further comprises a first light emission control circuit, the first light emission control circuit is configured to apply a first power supply voltage to the first terminal of the driving circuit under a control of a first light emission control signal;
- the pixel circuit further comprises a third reset circuit, the third reset circuit is configured to apply a holding voltage to the first terminal of the driving circuit under a control of a third reset control signal, the third reset control signal and the first reset control signal both are turn-on signals in at least part of a time period; and
- the third reset circuit comprises a sixth transistor which is an N-type thin film transistor, a gate electrode of the sixth transistor is connected to a third reset control signal terminal to receive the third reset control signal, a first electrode of the sixth transistor is connected to a holding voltage terminal to receive the holding voltage, and a second electrode of the sixth transistor is connected to the first terminal of the driving circuit.

18. The pixel circuit according to claim 17, wherein the driving circuit is turned on under a control of the first reset control signal, and a time period for which the driving circuit is turned on is greater than an effective period of the third reset control signal.

* * * * *